United States Patent
Kim et al.

(10) Patent No.: US 12,300,768 B2
(45) Date of Patent: May 13, 2025

(54) LIGHT EMITTING ELEMENT, DISPLAY DEVICE INCLUDING THE SAME, AND MANUFACTURING METHOD OF LIGHT EMITTING ELEMENT

(71) Applicant: Samsung Display Co., LTD., Yongin-si (KR)

(72) Inventors: Hyung Seok Kim, Yongin-si (KR); Si Sung Kim, Yongin-si (KR); Jong Jin Lee, Yongin-si (KR); Dong Eon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 467 days.

(21) Appl. No.: 17/704,659

(22) Filed: Mar. 25, 2022

(65) Prior Publication Data

US 2023/0062301 A1 Mar. 2, 2023

(30) Foreign Application Priority Data

Aug. 30, 2021 (KR) .......................... 10-2021-0115118

(51) Int. Cl.
*H01L 33/44* (2010.01)
*H01L 25/16* (2023.01)
(Continued)

(52) U.S. Cl.
CPC ............ *H01L 33/44* (2013.01); *H01L 25/167* (2013.01); *H01L 33/007* (2013.01);
(Continued)

(58) Field of Classification Search
CPC ..... H01L 33/44; H01L 25/167; H01L 33/007; H01L 33/0075; H01L 33/38
(Continued)

(56) References Cited

U.S. PATENT DOCUMENTS

| 7,262,454 B2 * | 8/2007 | Kim .................... H01L 27/1248 |
| | | 438/149 |
| 7,427,785 B2 | 9/2008 | Song |
| | | (Continued) |

FOREIGN PATENT DOCUMENTS

| KR | 10-0717276 | 5/2007 |
| KR | 10-0720101 | 5/2007 |
| | (Continued) | |

OTHER PUBLICATIONS

International Search Report corresponding to International Application No. PCT/KR2022/005785 dated Aug. 8, 2022.

*Primary Examiner* — Ori Nadav
(74) *Attorney, Agent, or Firm* — KILE PARK REED & HOUTTEMAN PLLC

(57) ABSTRACT

A light emitting element includes a first semiconductor layer; an emission layer disposed on the first semiconductor layer; a second semiconductor layer disposed on the emission layer; an electrode layer disposed on the second semiconductor layer; and an insulating film surrounding side surfaces of the first semiconductor layer, the emission layer, and the second semiconductor layer and surrounding a portion of the electrode layer at an end portion of the light emitting element on which the electrode layer is disposed. The electrode layer includes a first surface adjacent to the second semiconductor layer; a second surface facing the first surface and having a width less than a width of the first surface; and a side surface that connects the first surface and the second surface and has a slope in a range of about 75° to about 90° with respect to the first surface of the electrode layer.

15 Claims, 25 Drawing Sheets

(51) Int. Cl.
*H01L 33/00* (2010.01)
*H01L 33/38* (2010.01)
*H01L 23/00* (2006.01)
*H01L 33/20* (2010.01)

(52) U.S. Cl.
CPC .......... *H01L 33/0075* (2013.01); *H01L 33/38* (2013.01); *H01L 24/24* (2013.01); *H01L 24/25* (2013.01); *H01L 24/95* (2013.01); *H01L 33/0093* (2020.05); *H01L 33/20* (2013.01); *H01L 2224/24051* (2013.01); *H01L 2224/24227* (2013.01); *H01L 2224/25175* (2013.01); *H01L 2224/95133* (2013.01); *H01L 2933/0016* (2013.01); *H01L 2933/0025* (2013.01)

(58) Field of Classification Search
USPC .......................................................... 257/99
See application file for complete search history.

(56) References Cited

U.S. PATENT DOCUMENTS

| | | | |
|---|---|---|---|
| 7,583,025 B2* | 9/2009 | Woo | H01J 11/46 313/46 |
| 9,287,446 B2 | 3/2016 | Yoo et al. | |
| 9,329,433 B2 | 5/2016 | Negishi et al. | |
| 10,128,307 B2* | 11/2018 | Chang | H01L 33/385 |
| 10,388,641 B2* | 8/2019 | Martin | H01L 24/13 |
| 2008/0258133 A1 | 10/2008 | Seong | |
| 2009/0009057 A1* | 1/2009 | Lee | H05B 33/22 257/14 |
| 2014/0235001 A1* | 8/2014 | Chen | H01L 33/62 438/29 |
| 2014/0363910 A1* | 12/2014 | Chen | H01L 33/0062 438/33 |
| 2022/0254959 A1 | 8/2022 | Lee et al. | |

FOREIGN PATENT DOCUMENTS

| | | |
|---|---|---|
| KR | 10-2015-0113288 | 10/2015 |
| KR | 10-2016-0087550 | 7/2016 |
| KR | 10-1674052 | 11/2016 |
| KR | 10-2021-0003991 | 1/2021 |
| KR | 10-2021-0008206 | 1/2021 |

* cited by examiner

PXL: PXL1, PXL2, PXL3

LIGHT EMITTING ELEMENT, DISPLAY DEVICE INCLUDING THE SAME, AND MANUFACTURING METHOD OF LIGHT EMITTING ELEMENT

CROSS-REFERENCE TO RELATED APPLICATION(S)

This application claims priority to and benefits of Korean Patent Application No. 10-2021-0115118 under 35 U.S.C. § 119, filed in the Korean Intellectual Property Office on Aug. 30, 2021, the entire contents of which are incorporated herein by reference.

BACKGROUND

1. Technical Field

Embodiments relate to a light emitting element, a display device including the same, and a manufacturing method of the light emitting element.

2. Description of the Related Art

Recently, interest in an information display is increasing. Accordingly, research and development on a display device are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting element that may prevent short circuit defects, a display device including the same, and a manufacturing method of the light emitting element.

Objects of the disclosure are not limited to the objects mentioned above, and other technical objects that are not mentioned may be clearly understood to a person of ordinary skill in the art by the following description.

Alight emitting element according to an embodiment may include a first semiconductor layer; an emission layer disposed on the first semiconductor layer; a second semiconductor layer disposed on the emission layer; an electrode layer disposed on the second semiconductor layer; and an insulating film surrounding side surfaces of the first semiconductor layer, the emission layer, and the second semiconductor layer and surrounding a portion of the electrode layer at an end portion of the light emitting element on which the electrode layer is disposed. The electrode layer may include a first surface adjacent to the second semiconductor layer; a second surface facing the first surface and having a width less than a width of the first surface; and a side surface that connects the first surface and the second surface and has a slope in a range of about 75° to about 90° with respect to the first surface of the electrode layer.

The insulating film may completely surround the side surfaces of the emission layer and the second semiconductor layer.

The electrode layer may directly electrically contact the second semiconductor layer on the first surface of the electrode layer.

The insulating film may surround a portion of the side surface of the electrode layer disposed around the first surface of the electrode layer, and may expose the second surface of the electrode layer and a remaining portion of the side surface of the electrode layer.

The insulating film may expose a lower surface of the first semiconductor layer.

The insulating film may have a uniform thickness at the end portion of the light emitting element.

The insulating film may have a surface profile corresponding to a shape of each side surface of the first semiconductor layer, the emission layer, and the second semiconductor layer in a portion surrounding the first semiconductor layer, the emission layer, and the second semiconductor layer.

The insulating film may have a surface profile corresponding to a shape of the side surface of the electrode layer at the end portion of the light emitting element.

The insulating film may have a thickness that is gradually changed at the end portion of the light emitting element.

The insulating film may have a thickness that increases approaching the emission layer at the end portion of the light emitting element.

The first semiconductor layer may include a first portion adjacent to the emission layer and a second portion excluding the first portion, and a width of the first portion may be greater than a width of the second portion.

A thickness of a portion surrounding the second portion of the first semiconductor layer may be greater than a width of a portion surrounding the first portion of the first semiconductor layer in the insulating film.

The insulating film may have a thickness of about 10 nm or more at a portion corresponding to the first surface of the electrode layer.

A display device according to an embodiment may include a pixel including a first electrode; a second electrode; and a light emitting element that may include a first end portion electrically connected to the first electrode; and a second end portion electrically connected to the second electrode. The light emitting element may include a first semiconductor layer, an emission layer, a second semiconductor layer, and an electrode layer, sequentially disposed in a direction from the second end portion to the first end portion of the light emitting element; and an insulating film surrounding side surfaces of the first semiconductor layer, the emission layer, the second semiconductor layer, and the electrode layer. The electrode layer may include a first surface adjacent to the second semiconductor layer; a second surface facing the first surface and having a width less than a width of the first surface; and a side surface that connects the first surface and the second surface and has a slope in a range of about 75° to about 90° with respect to the first surface of the electrode layer.

The insulating film may completely surround the side surfaces of the emission layer and the second semiconductor layer.

The electrode layer may directly electrically contact the second semiconductor layer on the first surface. The insulating film may surround a portion of the side surface of the electrode layer disposed around the first surface of the electrode layer, and may expose the second surface of the electrode layer and a remaining portion of the side surface of the electrode layer.

A manufacturing method of a light emitting element according to an embodiment may include sequentially forming a first semiconductor layer, an emission layer, a second semiconductor layer, and an electrode layer on a substrate; sequentially forming a mask layer and an etching pattern on the electrode layer; patterning a stacked body including the first semiconductor layer, the emission layer, the second semiconductor layer, and the electrode layer in a rod shape by an etching process using the mask layer and the etching pattern; forming an insulating film on side surfaces of the first semiconductor layer, the emission layer, the second semiconductor layer, and the electrode layer; and separating the light emitting element from the substrate. In the patterning of the stacked body in the rod shape, the electrode layer may be etched so that a side surface of the electrode layer has a slope in a range of about 75° to about 90° with respect to the substrate.

The mask layer may be formed with a thickness of about 2 μm or more.

The forming of the mask layer may include forming a first mask layer with a thickness of about 2 μm or more on the electrode layer; and forming a second mask layer with a thickness of about 160 nm or more on the first mask layer by using a material different from a material of the first mask layer.

The forming of the insulating film may include forming the insulating film entirely on a surface of the substrate including the stacked body; and etching the insulating film so that an upper surface of the electrode layer is exposed.

Other embodiments are included in the detailed description and drawings.

Embodiments provide a light emitting element that may include a first semiconductor layer, an emission layer, a second semiconductor layer, and an electrode layer sequentially disposed and/or stacked along a direction, and an insulating film surrounding side surfaces of the first semiconductor layer, the emission layer, the second semiconductor layer, and the electrode layer, wherein a side surface of the electrode layer may have a slope ranging from about 75° to about 90°. Embodiments provide a display device including the light emitting element, and a manufacturing method of the light emitting element.

According to embodiments, an insulating film having a sufficient thickness may be formed even around the electrode layer. For example, the insulating film may be formed to have a thickness sufficient to include an over-etching margin that may occur in a subsequent process around the electrode layer and the second semiconductor layer adjacent to the electrode layer.

Accordingly, even if the insulating film of the light emitting element is partially etched in a pixel process or the like, the insulating film may remain on a surface of the light emitting element while stably surrounding the second semiconductor layer. Accordingly, it is possible to prevent a short circuit defect through the light emitting element.

Effects of embodiments of the disclosure are not limited by what is illustrated in the above, and more various effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
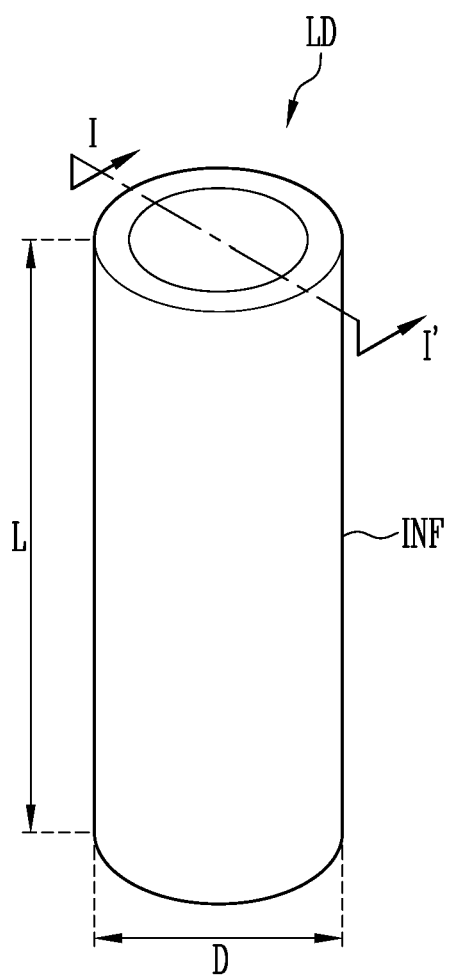
FIG. 1 illustrates a schematic perspective view of a light emitting element according to an embodiment.

Since the disclosure may be variously modified and have various forms, embodiments will be illustrated and described in detail in the following. In the description below, singular forms are to include plural forms unless the context clearly indicates only the singular. For example, as used herein, the singular forms, "a," "an," and "the" are intended to include the plural forms as well, unless the context clearly indicates otherwise.

The disclosure is not limited to the embodiments disclosed hereinafter and may be implemented in various forms. Each embodiment disclosed below may be implemented alone, or may be implemented in combination with at least one other embodiment.

Some of the elements not directly related to the features of the disclosure may be omitted from the drawing in order to clearly illustrate the disclosure. For the same or similar elements throughout drawing, the same reference numerals and symbols are to be given as much as possible, and duplicate descriptions will be omitted.

In the drawings, sizes, thicknesses, ratios, and dimensions of the elements may be exaggerated for ease of description and for clarity. Like numbers refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In describing embodiments, the term "connection (or coupling)" may comprehensively mean a physical and/or electrical connection (or coupling). It may comprehensively mean a direct connection (or coupling) and an indirect connection (or coupling), and may comprehensively mean an integral connection (or coupling) and a non-integral connection (or coupling).

Figure 2:
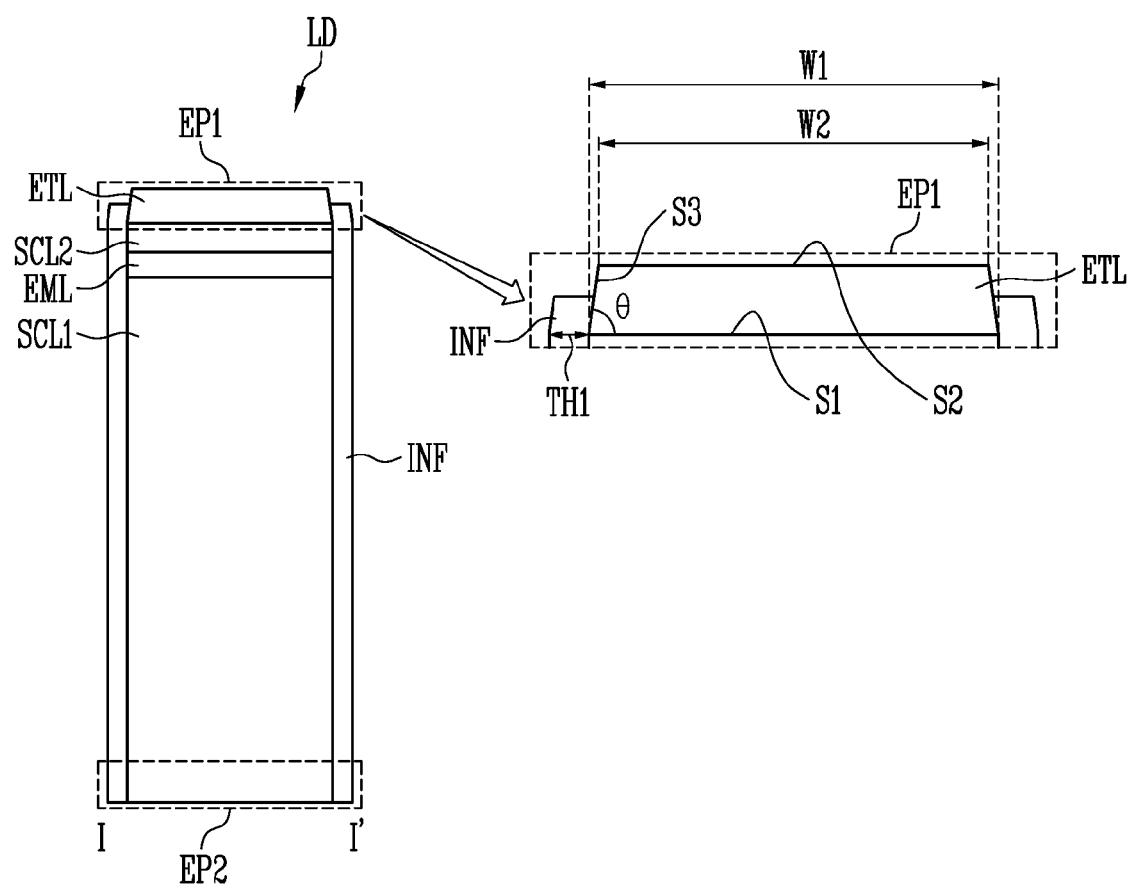
FIG. 2 illustrates a schematic cross-sectional view of a light emitting element according to an embodiment.

FIG. 1 illustrates a schematic perspective view of a light emitting element LD according to an embodiment. FIG. 2 illustrates a schematic cross-sectional view of a light emitting element LD according to an. For example, FIG. 2 shows an embodiment of a cross-section of the light emitting element LD corresponding to line I-I' in FIG. 1.

Referring to FIG. 1 and FIG. 2, the light emitting element LD may include a first semiconductor layer SCL1, an emission layer EML, a second semiconductor layer SCL2, and an electrode layer ETL sequentially disposed and/or stacked each other along one direction or a direction (for example, length direction or thickness direction). In an embodiment, the light emitting element LD may further include at least one other semiconductor layer (for example, at least one other semiconductor layer disposed above and/or below the light emitting layer EML) and/or at least one electrode layer (for example, an electrode layer disposed around the first semiconductor layer SCL1).

In an embodiment, the light emitting element LD may be provided in a rod shape. In describing an embodiment, the rod shape may include a rod-like shape or bar-like shape of various types including a circular pillar shape or a polygonal pillar shape, and a shape of a cross-section thereof is not particularly limited. In an embodiment, a length L of the light emitting element LD may be larger or greater than a diameter D thereof (or a width of a lateral cross-section thereof). It is to be understood that the shapes disclosed herein may include shapes substantially identical or similar to the shapes.

The light emitting element LD may include a first end portion EP1 and a second end portion EP2 that face each other. For example, the light emitting element LD may include the first end portion EP1 and the second end portion EP2 at both ends of a length direction (or a thickness direction) thereof. The first end portion EP1 of the light emitting element LD may include a first base surface (for example, an upper surface) of the light emitting element LD and/or a peripheral area thereof. The second end portion EP2 of the light emitting element LD may include a second base surface (for example, a lower surface) of the light emitting element LD and/or a peripheral area thereof.

In an embodiment, the first semiconductor layer SCL1, the emission layer EML, the second semiconductor layer SCL2, and the electrode layer ETL may be sequentially disposed in a direction from the second end portion EP2 to the first end portion EP1 of the light emitting element LD. For example, the electrode layer ETL may be disposed on the first end portion EP1 of the light emitting element LD, and the first semiconductor layer SCL1 (or another electrode layer adjacent to the first semiconductor layer SCL1 and electrically connected to the first semiconductor layer SCL1) may be disposed on the second end portion EP2 of the light emitting element LD.

The light emitting element LD may further include an insulating film INF covering or overlapping side surfaces of the first semiconductor layer SCL1, the emission layer EML, and the second semiconductor layer SCL2. The insulating film INF may at least partially cover or overlap a side surface of the electrode layer ETL. For example, the insulating film INF may surround a portion of the electrode layer ETL at the first end portion EP1. For example, the insulating film INF may surround a portion (for example, a lower layer) of a side surface S3 of the electrode layer ETL, and it may not surround the remaining portion (for example, an upper layer) of the side surface S3 of the electrode layer ETL.

The first semiconductor layer SCL1 may include a first conductive type of semiconductor layer including a first conductive type of dopant. For example, the first semiconductor layer SCL1 may be an N-type of semiconductor layer including an N-type of dopant.

In an embodiment, the first semiconductor layer SCL1 may include a nitride-based semiconductor material or a phosphide-based semiconductor material. For example, the first semiconductor layer SCL1 may include a nitride-based semiconductor material including at least one of GaN, AlGaN, InGaN, AlInGaN, AlN, and InN, or a phosphide-based semiconductor material including at least one of GaP, GaInP, AlGaP, AlGaInP, AlP, and InP. In an embodiment, the first semiconductor layer SCL1 may include an N-type of dopant such as Si, Ge, Sn, or the like within the spirit and the scope of the disclosure. The material included in the first semiconductor layer SCL1 is not limited thereto, and, various materials may be used to form the first semiconductor layer SCL1.

The emission layer EML (also referred to as an "active layer") may be disposed on the first semiconductor layer SCL1. The emission layer EML may include a single or multiple quantum well (QW) structure. In case that a voltage of a threshold voltage or more is applied to both ends of the light emitting element LD, light may be emitted while electron-hole pairs are recombined in the emission layer EML.

In an embodiment, the emission layer EML may emit light of a visible ray wavelength band, for example, light of a wavelength band in a range of about 400 nm to about 900 nm. For example, the emission layer EML may emit blue light having a wavelength ranging from about 450 nm to about 480 nm, green light having a wavelength ranging from about 480 nm to about 560 nm, or red light having a wavelength ranging from about 620 nm to about 750 nm. The color and/or wavelength band of the light generated by the emission layer EML may be changed.

In an embodiment, the emission layer EML may include a nitride-based semiconductor material or a phosphide-based semiconductor material. For example, the emission layer EML may include a nitride-based semiconductor material including at least one of GaN, AlGaN, InGaN, InGaAlN, AlN, InN, and AlInN, or a phosphide-based semiconductor material including at least one of GaP, GaInP, AlGaP, AlGaInP, AlP, and InP. The material included in the emission layer EML is not limited thereto, and, various materials may be used to form the emission layer EML.

In an embodiment, the emission layer EML may include an element involved in a color (or wavelength band) of light, and a color of light generated in the emission layer EML by adjusting a content and/or composition ratio of the element may be controlled. For example, the emission layer EML may be formed to have a multi-layered structure in which a GaN layer and an InGaN layer are alternately and/or repeatedly stacked with each other, and it may emit light of a specific or given color according to a content and/or composition ratio of indium (In) included in the InGaN layer. Accordingly, the light emitting element LD of a desired color may be manufactured by adjusting the content and/or composition ratio of indium (In) included in the emission layer EML.

The second semiconductor layer SCL2 may be disposed on the emission layer EML. The second semiconductor layer SCL2 may include a second conductive type of semiconductor layer including a second conductive type of dopant. For example, the second semiconductor layer SCL2 may be a P-type of semiconductor layer including a P-type of dopant.

In an embodiment, the second semiconductor layer SCL2 may include a nitride-based semiconductor material or a phosphide-based semiconductor material. For example, the second semiconductor layer SCL2 may include a nitride-based semiconductor material including at least one of GaN, AlGaN, InGaN, AlInGaN, AlN, and InN, or a phosphide-based semiconductor material including at least one of GaP, GaInP, AlGaP, AlGaInP, AlP, and InP. In an embodiment, the second semiconductor layer SCL2 may include a P-type of dopant such as Mg. The material included in the second semiconductor layer SCL2 is not limited thereto, and, various materials may be used to form the second semiconductor layer SCL2.

In an embodiment, the first semiconductor layer SCL1 and the second semiconductor layer SCL2 may include the same semiconductor material, but may include dopants of different conductive types. In an embodiment, the first semiconductor layer SCL1 and the second semiconductor layer SCL2 may include different semiconductor materials, and may include dopants of different conductive types.

In an embodiment, the first semiconductor layer SCL1 and the second semiconductor layer SCL2 may have different lengths (or thicknesses) in the length direction of the light emitting element LD. For example, the first semiconductor layer SCL1 may have a longer length (or thicker thickness) than that of the second semiconductor layer SCL2 along the length direction of the light emitting element LD. Accordingly, the emission layer EML may be positioned closer to the first end portion EP1 (for example, the P-type of end portion) than the second end portion EP2 (for example, the N-type of end portion).

The electrode layer ETL may be disposed on the second semiconductor layer SCL2. For example, the electrode layer ETL may be formed on or directly formed on the second semiconductor layer SCL2 so as to be in contact with the second semiconductor layer SCL2 on a first surface S1. In an embodiment, the electrode layer ETL and the second semiconductor layer SCL2 may have a width and/or surface area corresponding to each other at a bonding surface. For example, the electrode layer ETL and the second semiconductor layer SCL2 may have a same width and/or surface area at the bonding surface, and may have substantially a same cross-section.

The electrode layer ETL may protect the second semiconductor layer SCL2, and may form an electrode for readily connecting the second semiconductor layer SCL2 to an electrode or wire. For example, the electrode layer ETL may be an ohmic contact electrode or a Schottky contact electrode.

In an embodiment, the electrode layer ETL may include metal or a metal oxide. For example, the electrode layer ETL may be formed by singly using or mixing a metal such as chromium (Cr), titanium (Ti), aluminum (Al), gold (Au), nickel (Ni), or copper (Cu), and an oxide or alloy thereof; and a transparent conductive material such as an indium tin oxide (ITO), an indium zinc oxide (IZO), an indium tin zinc oxide (ITZO), a zinc oxide (ZnO), or an indium oxide (In$_2$O$_3$). The material forming the electrode layer ETL is not limited thereto, and, various conductive materials may be used to form the electrode layer ETL.

In an embodiment, the electrode layer ETL may be substantially transparent. Accordingly, light generated by the light emitting element LD may pass through the electrode layer ETL to be emitted from the first end portion EP1 of the light emitting element LD.

The electrode layer ETL may include a first surface S1 (for example, a lower surface of the electrode layer ETL) and a second surface S2 (for example, an upper surface of the electrode layer ETL) facing each other. The electrode layer ETL may include a side surface S3 (also referred to as a "third surface" of the electrode layer ETL) connecting the first surface S1 and the second surface S2.

In an embodiment, the first surface S1 and the second surface S2 of the electrode layer ETL may have different widths and/or areas. For example, the second surface S2 of the electrode layer ETL may have a smaller (for example, less than or narrower) width and/or area than the first surface S1 of the electrode layer ETL. For example, the first surface S1 of the electrode layer ETL may have a first width W1, the second surface S2 of the electrode layer ETL may have a second width W2 smaller (or less than) than the first width W1 and an area smaller (or less than) than the first surface S1.

In an embodiment, the side surface S3 of the electrode layer ETL may have a slope inclined by an angle (θ) of a range with respect to the first surface S1 (or the bottom surface of the light emitting element LD) of the electrode layer ETL. For example, the side surface S3 of the electrode layer ETL may have a slope corresponding to an angle (θ) in a range of about 75° to about 90° with respect to the first surface S1 of the electrode layer ETL. In case that the side surface S3 of the electrode layer ETL has a slope corresponding to an angle (θ) of about 75° or more, the insulating layer INF with a sufficient thickness may be formed even at the first end EP1 and its periphery (for example, peripheries of the electrode layer ETL and the second semiconductor layer SCL2).

In an embodiment, the side surface S3 of the electrode layer ETL may have a steep slope corresponding to an angular range of about 80° or more, for example, about 80° or more and less than about 90° with respect to the first side S1 of the electrode layer ETL, and it may be substantially perpendicular to the first surface S1 of the electrode layer ETL. Even if a deviation according to a process margin is considered, the insulating film INF may be formed to have a sufficient thickness at and around the first end portion EP1. Accordingly, even if over-etching occurs in a subsequent process, the insulating film INF may completely surround the second semiconductor layer SCL2 and remain around the second semiconductor layer SCL2.

In an embodiment, the electrode layer ETL may have a small thickness in a range of about 100 nm to about 200 nm, and, the thickness of the electrode layer ETL may be variously changed according to embodiments. In case that the electrode layer ETL has a relatively small thickness (for example, the example thickness in a range of about 100 nm to about 200 nm), reduction in light emitting efficiency of the light emitting element LD due to the provision of the electrode layer ETL may be prevented or minimized, and the electrode layer ETL may be more readily formed in a desired shape. For example, in case that the electrode layer ETL has a relatively small thickness, the electrode layer ETL may be readily patterned so that the side surface S3 of the electrode layer ETL has a slope corresponding to an angle (θ) of about 75° or more (for example, about 80° or more).

The insulating film INF may be provided on a surface of the light emitting element LD to surround side surfaces of the first semiconductor layer SCL1, the emission layer EML, the second semiconductor layer SCL2, and the electrode layer ETL.

In case that the insulating film INF is provided on the surface of the light emitting element LD, a short circuit defect through the light emitting element LD may be prevented. Therefore, electrical stability of the light emitting element LD may be secured. In case that the insulating film INF is provided on the surface of the light emitting element LD, it is possible to improve life-span and efficiency thereof by minimizing surface defects of the light emitting element LD.

The insulating film INF may include a transparent insulating material. Accordingly, light generated in the emission layer EML may transmit through the insulating film INF to be emitted to the outside of the light emitting element LD. For example, the insulating film INF may include at least one insulating material of a silicon oxide (SiOx) (for example, SiO2), a silicon nitride (SiNx) (for example, Si3N4), an aluminum oxide (AlxOy) (for example, Al2O3), a titanium oxide (TixOy) (for example, TiO2), and a hafnium oxide (HfOx), or other insulating materials.

The insulating film INF may be formed as a single layer or multilayer. For example, the insulating film INF may be formed as a double film.

The insulating film INF may expose the electrode layer ETL and the first semiconductor layer SCL1 (or another electrode layer provided at the second end portion EP2 of the light emitting element LD) at the first end portion EP1 and the second end portion EP2 of the light emitting element LD, respectively. For example, the insulating film INF may not be provided on the second surface S2 of the electrode layer ETL, and accordingly, it may expose the second surface S2 of the electrode layer ETL in the first end portion EP1 of the light emitting element LD. Accordingly, driving power and/or a signal may be applied to the first end portion EP1 of the light emitting element LD by connecting the electrode layer ETL to at least one electrode, wire, and/or conductive pattern. The insulating film INF may not be provided on a lower surface of the first semiconductor layer SCL1 (for example, the bottom surface of the light emitting element LD), and accordingly, the bottom surface of the first semiconductor layer SCL1 may be exposed in the second end portion EP2 of the light emitting element LD. Accordingly, driving power and/or a signal may be applied to the second end portion EP2 of the light emitting element LD by connecting the first semiconductor layer SCL1 to at least one electrode, wire, and/or conductive pattern.

The insulating film INF may completely surround at least side surfaces of the emission layer EML and the second semiconductor layer SCL2. Accordingly, electrical stability of the light emitting element LD may be secured, and a short circuit defect through the light emitting element LD may be prevented.

In an embodiment, the insulating film INF may partially surround the side surface S3 of the electrode layer ETL. For example, the insulating film INF may surround a portion of the side surface S3 of the electrode layer ETL (for example, a lower portion of the side surface S3) positioned around the first surface S1 of the electrode layer ETL, and the second surface S2 of the electrode layer ETL and the remaining portion of the side surface S3 of the electrode layer ETL (for example, an upper portion of the side surface S3) positioned around the second surface S2 may be exposed. For example, in a process of removing the insulating film INF on the second surface S2 of the electrode layer ETL, the insulating film INF may also be removed on the upper portion of the side surface S3 of the electrode layer ETL positioned around the second surface S2.

In an embodiment, the insulating film INF may be formed with an overall uniform thickness. For example, the insulating film INF may have a uniform thickness (for example, a first thickness TH1) in the entire area including the first end portion EP1.

In an embodiment, the insulating film INF may have a surface profile corresponding to side shapes of the first semiconductor layer SCL1, the emission layer EML, the second semiconductor layer SCL2, and the electrode layer ETL. For example, the insulating film INF may have a surface profile corresponding to a shape of the side surface S3 of the electrode layer ETL at the first end portion EP1 surrounding the electrode layer ETL. For example, the insulating film INF may have a curved shape and/or a slope corresponding to the shape of the side surface of the electrode layer ETL at and/or around the first end portion EP1. In the remaining area thereof, the insulating layer INF may have a surface profile corresponding to the shape of the side surfaces of the first semiconductor layer SCL1, the emission layer EML, and the second semiconductor layer SCL2. For example, the insulating film INF, in a portion surrounding the first semiconductor layer SCL1, the emission layer EML, and the second semiconductor layer SCL2, may have surface profile corresponding respective side shapes of the first semiconductor layer SCL1, the emission layer EML, and the second semiconductor layer SCL2.

The thickness and/or surface profile of the insulating film INF may be varied according to embodiments. For example, the thickness and/or surface profile of the insulating film INF may be varied depending on a process method, process condition, and/or material applied to form the insulating film INF. In an embodiment, in case that the insulating film INF is formed by using an atomic layer deposition (ALD) process technology capable of forming a film having a high step coverage, the insulating film INF may have the surface profile corresponding to the side shapes (for example, following the side shapes) of the first semiconductor layer SCL1, the emission layer EML, the second semiconductor layer SCL2, and the electrode layer ETL, and may be formed with the overall uniform thickness.

In case that the side surface S3 of the electrode layer ETL has a slope corresponding to an angle ($\theta$) of about 75° or more (for example, in a range of about 80° to about 90°), the insulating film INF may be formed with a thickness sufficient to stably surround the second semiconductor layer SCL2 in an area corresponding to the bonding surface of the emission layer EML and the second semiconductor layer SCL2. For example, the insulating film INF may have the first thickness TH1 of about 10 nm or more in a portion corresponding to the first surface S1 of the electrode layer ETL.

In a lower portion of the area corresponding to the bonding surface of the emission layer EML and the second semiconductor layer SCL2 (for example, in an area surrounding the second semiconductor layer SCL2, the emission layer EML, and the first semiconductor layer SCL1), the insulating film INF may be formed with a thickness that is substantially the same as or larger or greater than the first thickness TH1 in the area corresponding to the bonding surface of the emission layer EML and the second semiconductor layer SCL2. For example, the insulating film INF may have a thickness equal to or larger or greater than the first thickness TH1 in the lower portion of the area corresponding to the bonding surface of the emission layer EML and the second semiconductor layer SCL2, and may completely surround at least side surfaces of the second semiconductor layer SCL2 and the emission layer EML.

The insulating film INF, even in case that it is etched by a partial thickness around the second semiconductor layer SCL2 and/or the emission layer EML by over-etching that may occur in a process of etching the insulating film INF in order to expose the electrode layer ETL at the first end portion EP1 and/or other subsequent processes (for example, a pixel process for forming a pixel by using the light emitting element LD), may be formed with a sufficient thickness that may remain on the side surfaces of the second semiconductor layer SCL2 and the emission layer EML. For example, the insulating film INF may be formed with a thickness (for example, a thickness of about 10 nm or more) sufficient to stably surround the second semiconductor layer SCL2 and the light emitting layer EML, including an over-etching margin that may occur in a subsequent process.

In an embodiment, the light emitting element LD may have a small size in a range of nanometers to micrometers. For example, the light emitting element LD may each have a diameter D (or a width of a lateral cross-section) and/or a length L ranging from a nanometer to micrometer. For example, the light emitting element LD may have a diameter D and/or a length L ranging from approximately several tens of nanometers to several tens of micrometers. However, the size of the light emitting element LD may be changed.

The structure, shape, size, and/or type of the light emitting element LD may be changed according to embodiments. For example, the structure, shape, size, and/or type of the light emitting element LD may be variously changed according to a design condition of a light emitting device using the light emitting element LD or a light emitting characteristic to be secured.

The light emitting device including the light emitting element LD may be used in various types of devices that require a light source. For example, the light emitting elements LD may be disposed in a pixel of a display device, and the light emitting elements LD may be used as a light source of the pixel. The light emitting element LD may be used in other types of devices that require a light source, such as a lighting device.

FIG. 3 to FIG. 7 respectively illustrate a schematic cross-sectional view of a light emitting element LD according to an embodiment. For example, FIG. 3 to FIG. 7 show different modified embodiments with respect to an embodiment of FIG. 2 in relation to the cross-section of the light emitting element LD corresponding to line I-I' of FIG. 1. In describing embodiments of FIG. 3 to FIG. 7, the same reference numerals are denoted to configurations similar to or identical to those of the above-described embodiments, and duplicate descriptions thereof will be omitted.

Figure 3:
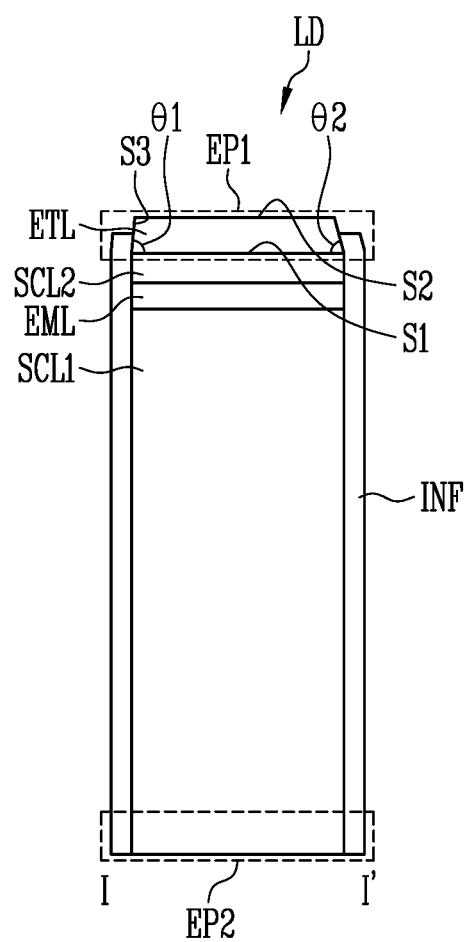
FIG. 3 to FIG. 7 respectively illustrate a schematic cross-sectional view of a light emitting element according to an embodiment.

Referring to FIG. 3, the electrode layer ETL may be left-right asymmetrical, and respective portions of the side surface S3 may have different angles and/or slopes. For example, on a longitudinal cross-section of the light emitting element LD, the side surface S3 of the electrode layer ETL may have a slope of a first angle $\theta1$ on the left side and a slope of a second angle $\theta2$ different from the first angle $\theta1$ on the right side. In an embodiment, each of the first angle $\theta1$ and the second angle $\theta2$ may be in a range of about 75° to about 90° (for example, a range of about 80° or more, about 90° or less or less than about 90°). The electrode layer ETL may substantially have a slope corresponding to an angle in a range of about 75° to about 90° in the side surface S3. Accordingly, the insulating film INF may be formed with a sufficient thickness around the electrode layer ETL.

Figure 4:
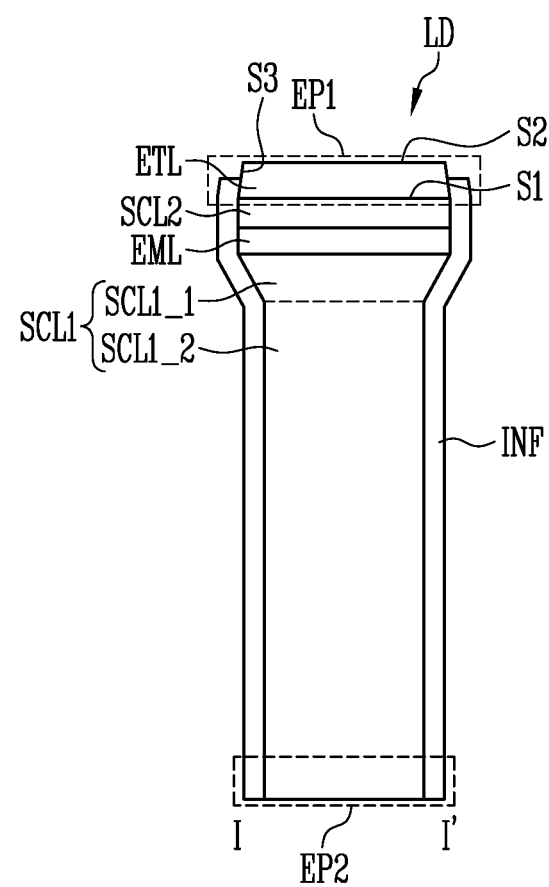

Referring to FIG. 4, the first semiconductor layer SCL1 may have a different width for each area and/or for each portion. For example, the first semiconductor layer SCL1 may have a larger etching ratio than that of the emission layer EML and/or the second semiconductor layer SCL2, and may have a smaller width and cross-sectional area in an area far from the emission layer EML than in an area close to the emission layer EML. For example, the first semiconductor layer SCL1 may include a first portion SCL1_1 adjacent to the emission layer EML and a second portion SCL1_2 excluding the first portion SCL1_1, and the first portion SCL1_1 may have a larger or greater width and cross-sectional area than that of the second portion SCL1_2.

Figure 5:
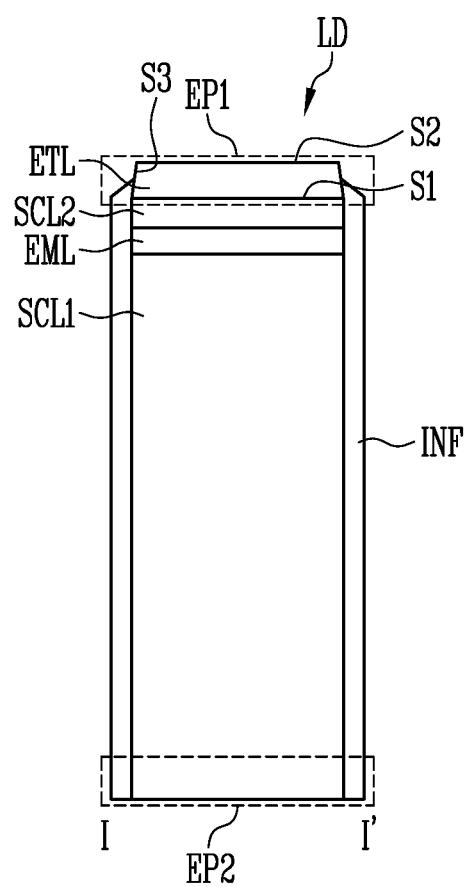
Figure 6:
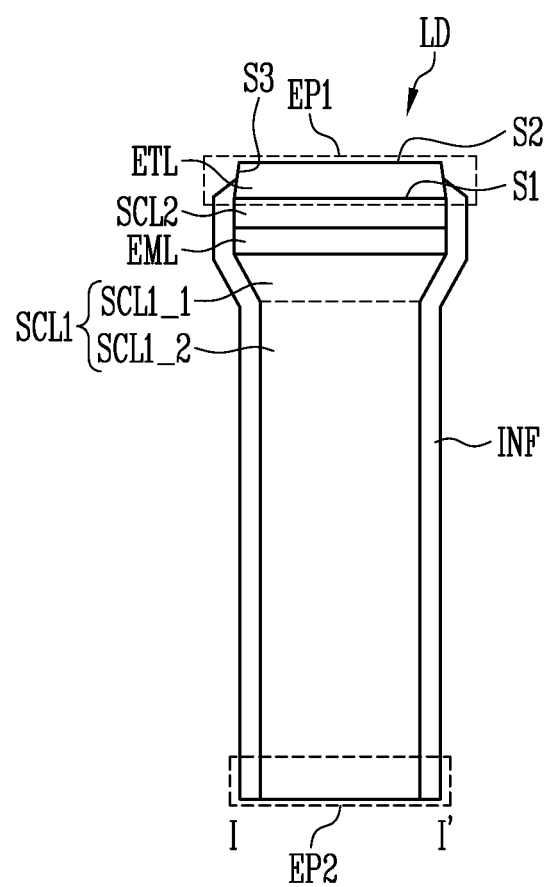

Referring to FIG. 5 and FIG. 6, the insulating film INF may have a different surface profile from a side shape of the electrode layer ETL (for example, a side profile of the electrode layer ETL) at the first end portion EP1. For example, at the first end portion EP1, the insulating film INF may have a thickness that is gradually changed, and may have a slope with an angle different from that of the slope of the side S3 of the electrode layer ETL. For example, the insulating film INF may have a thickness that increases as it approaches the emission layer EML at the first end portion EP1, and a thickness change rate of the insulating film INF at the first end portion EP1 may be larger or greater than a width change rate of the electrode layer ETL according to the side slope of the electrode layer ETL.

In an embodiment, in case that the insulating film INF is formed by utilizing a chemical vapor deposition (CVD) process technology, compared to the case of forming the insulating film INF by using the ALD process technology, the step cover of the insulating film INF may be low. Accordingly, the insulating film INF may have a different surface profile from the side profile of the electrode layer ETL at the first end portion EP1 and the like within the spirit and the scope of the disclosure.

Figure 7:
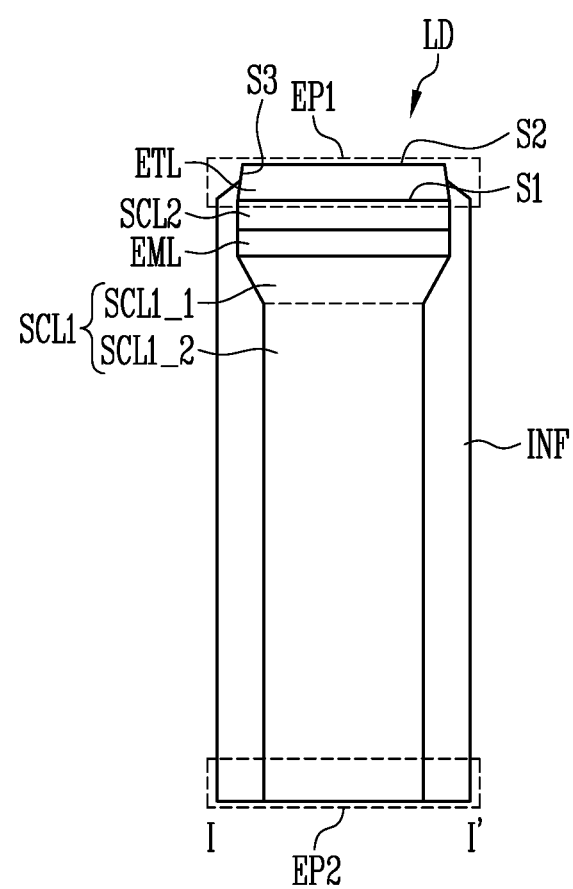
Figure 8:
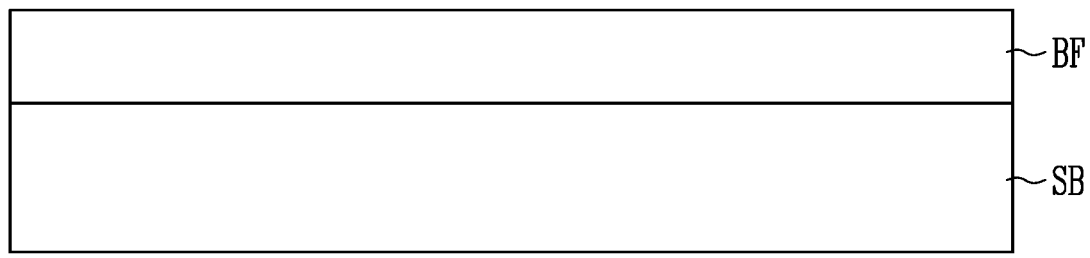
FIG. 8 to FIG. 17 illustrate schematic cross-sectional views of a manufacturing method of a light emitting element according to an embodiment.

Referring to FIG. 7, in an embodiment in which in the first semiconductor layer SCL1, the second portion SCL1_2 has a larger or greater width than the first portion SCL1_1, the insulating film INF does not follow the surface profile of the first semiconductor layer SCL1, but it may be formed with different thicknesses for each area and/or for each portion. For example, the insulating film INF may has a surface profile that is substantially perpendicular to the bottom surface (for example, the second end portion EP2) of the light emitting element LD regardless of a change in the width of the first semiconductor layer SCL1, and may have a larger or greater thickness in a portion surrounding the second portion SCL1_2 of the first semiconductor layer SCL1 than a portion surrounding the first portion SCL1_1 of the first semiconductor layer SCL1.

In an embodiment, the insulating film INF is formed by using a process technology that provides a relatively low step coverage characteristic, or an additional process (for example, a process of additionally forming the insulating film INF by a partial thickness in a partial area thereof, or a process of etching the insulating film INF by a partial thickness in a partial area thereof) is performed after the insulating film INF is first formed, so that the insulating film INF may be formed to have a different thickness for each area and/or for each portion.

Even in the above-described embodiments, the side surface S3 of the electrode layer ETL may have a slope of about 75° to 90°. Accordingly, the insulating film INF may be formed with a sufficient thickness around the electrode layer ETL including the circumferential area of the bonding surface of the electrode layer ETL and the second semiconductor layer SCL2. Accordingly, even in case that the insulating film INF is partially etched in a subsequent process, the insulating film INF may remain on the surface of the light emitting element LD while stably surrounding the second semiconductor layer SCL2 and the emission layer EML.

FIG. 8 to FIG. 17 illustrate schematic cross-sectional views of a manufacturing method of a light emitting element LD according to an embodiment. For example, FIG. 8 to FIG. 17 sequentially illustrate a manufacturing method of the light emitting element LD according to an embodiment of FIG. 1 and FIG. 2. The light emitting element LD according to embodiments of FIG. 3 to FIG. 7 may be manufactured through a manufacturing method that is substantially that same as or similar to that of the light emitting element LD according to an embodiment of FIG. 1 and FIG. 2. FIG. 8 to FIG. 17 illustrate an embodiment of manufacturing light emitting elements LD on one substrate SB.

Referring to FIG. 1 to FIG. 8, first, the substrate SB (also referred to as a "growth substrate" or "manufacture substrate") may be prepared. In an embodiment, a buffer layer BF may be formed on the substrate SB.

The substrate SB may be a substrate or wafer suitable for epitaxial growth (or epitaxy) of a semiconductor. For example, the substrate SB may be a substrate including a material such as silicon (Si), sapphire, SiC, GaN, GaAs, or ZnO. The substrate SB may be a substrate of various types and/or materials. For example, in case that the epitaxial growth for manufacturing the light emitting element LD may be smoothly performed, the type or material of the substrate SB is not particularly limited. After the substrate SB is used as a substrate for the epitaxial growth for the manufacturing of the light emitting elements LD, it may be finally separated from the light emitting elements LD.

In an embodiment, the buffer layer BF may be formed on the substrate SB. The buffer layer BF may be formed through the epitaxial growth on the substrate SB, and may be finally separated from the light emitting elements LD. The buffer layer BF may be positioned between the light emitting elements LD and the substrate SB in the process of manufacturing the light emitting elements LD to physically separate the light emitting elements LD and the substrate SB. In an embodiment, the buffer layer BF may include an impurity undoped intrinsic semiconductor layer, and may include a same semiconductor material as the first semiconductor layer SCL1. In an embodiment, the buffer layer BF may include multi-layered semiconductor layers. One of the multi-layered semiconductor layers may be an intrinsic semiconductor layer. The other of the multi-layered semiconductor layers may be a semiconductor layer doped to include a dopant of a first or second conductivity type, and may reduce a strain between the substrate SB and the first semiconductor layer SCL1.

Figure 9:
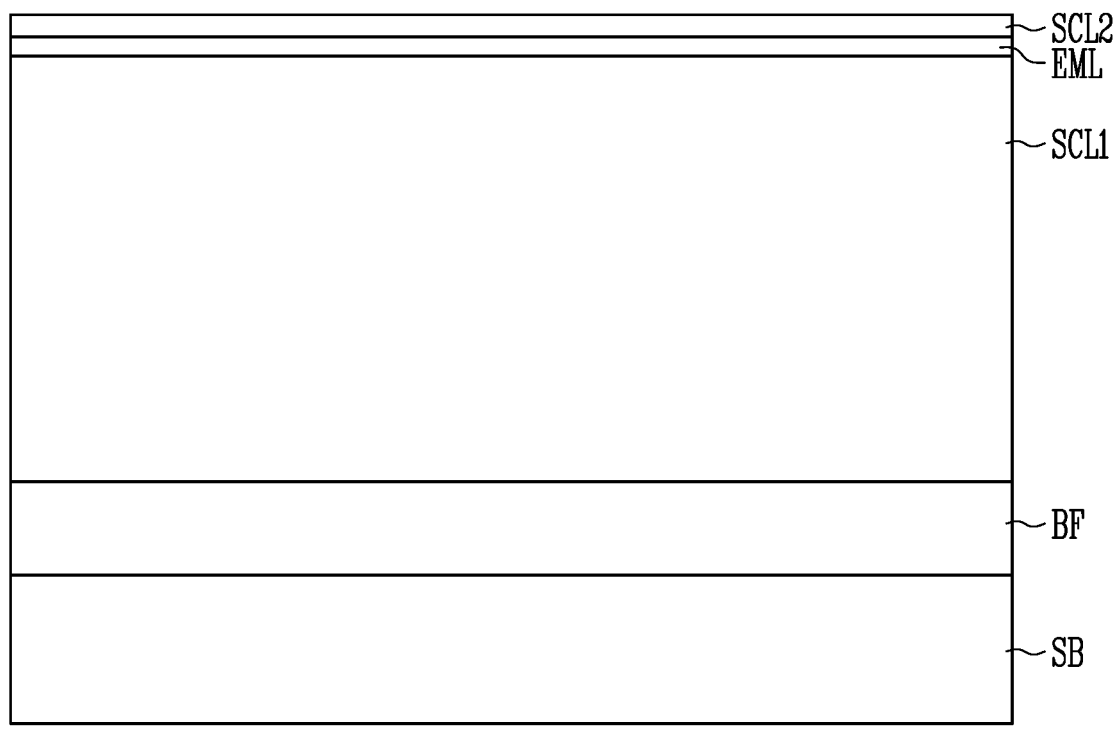

Referring to FIG. 9, the first semiconductor layer SCL1, the emission layer EML, and the second semiconductor layer SCL2 may be sequentially formed on the substrate SB. For example, the first semiconductor layer SCL1, the emission layer EML, and the second semiconductor layer SCL2 may be sequentially formed on the substrate SB on which the buffer layer BF is formed through the epitaxial growth.

The first semiconductor layer SCL1 may be made of the material of the first semiconductor layer SCL1 described in an embodiment of FIG. 1 and FIG. 2, or other semiconductor materials. The first semiconductor layer SCL1 may be doped to include an N-type of dopant such as Si, Ge, Sn, or the like within the spirit and the scope of the disclosure.

The first semiconductor layer SCL1 may be formed through epitaxial growth using a process technology such as metal-organic vapor phase epitaxy (MOVPE), metal-organic chemical vapor deposition (MOCVD), molecular beam epitaxy (MBE), liquid phase epitaxy (LPE), or vapor phase epitaxy (VPE), but the method of forming the first semiconductor layer SCL1 is not limited thereto.

The emission layer EML may be made of the material of the emission layer EML described in an embodiment of FIG. 1 and FIG. 2 or other semiconductor materials. In an embodiment, the emission layer EML may be formed through epitaxial growth utilizing a process technology such as MOVPE, MOCVD, MBE, LPE, or VPE, but the method of forming the emission layer EML is not limited thereto.

The second semiconductor layer SCL2 may be made of the material of the second semiconductor layer SCL2 described in an embodiment of FIG. 1 and FIG. 2, or other semiconductor materials. The second semiconductor layer SCL2 may be doped to include a P-type of dopant such as Mg. In an embodiment, the second semiconductor layer SCL2 may be formed through epitaxial growth utilizing a process technology such as MOVPE, MOCVD, MBE, LPE, or VPE, but the method of forming the second semiconductor layer SCL2 is not limited thereto.

Figure 10:
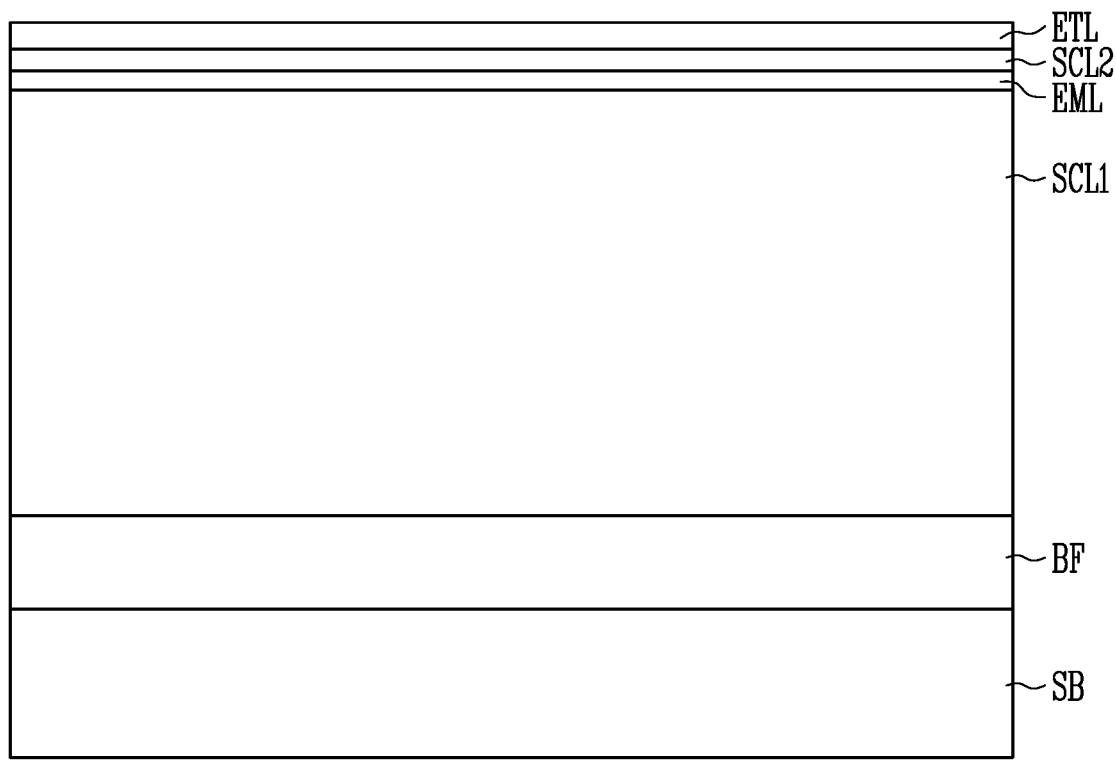

Referring to FIG. 10, the electrode layer ETL may be formed on the second semiconductor layer SCL2. For example, the electrode layer ETL may be entirely formed on one surface or a surface (for example, an upper surface) of the substrate SB in which the first semiconductor layer SCL1, the emission layer EML, and the second semiconductor layer SCL2 are sequentially formed. In an embodiment, the electrode layer ETL may be made of the material of the electrode layer ETL described in an embodiment of FIGS. 1 and 2 or other conductive materials.

Referring to FIG. 11 to FIG. 14, by etching the first semiconductor layer SCL1, the emission layer EML, the second semiconductor layer SCL2, and the electrode layer ETL in a direction substantially perpendicular to the substrate SB, a multi-layered stacked body LES (also referred to as a "light emitting stacked body" or "light emitting core") including the first semiconductor layer SCL1, the emission layer EML, the second semiconductor layer SCL2, and the electrode layer ETL may be patterned in a rod shape. Accordingly, the light emitting element LD having the rod shape may be manufactured.

In an embodiment, the light emitting element LD may be patterned by a patterning process utilizing a nano imprint lithography process technology or a photo lithography process technology. For example, the light emitting element LD may be patterned by using the nano imprint lithography process technology.

Figure 11:
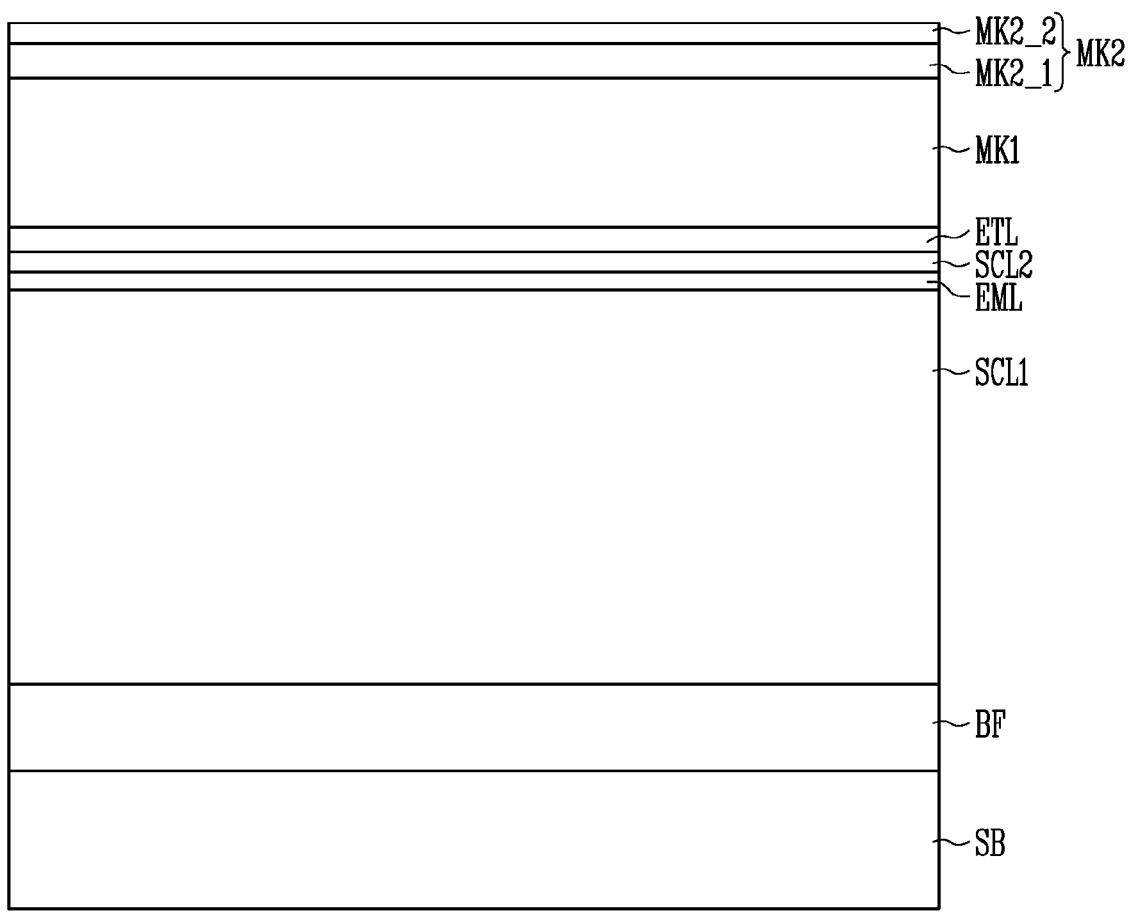
Figure 12:
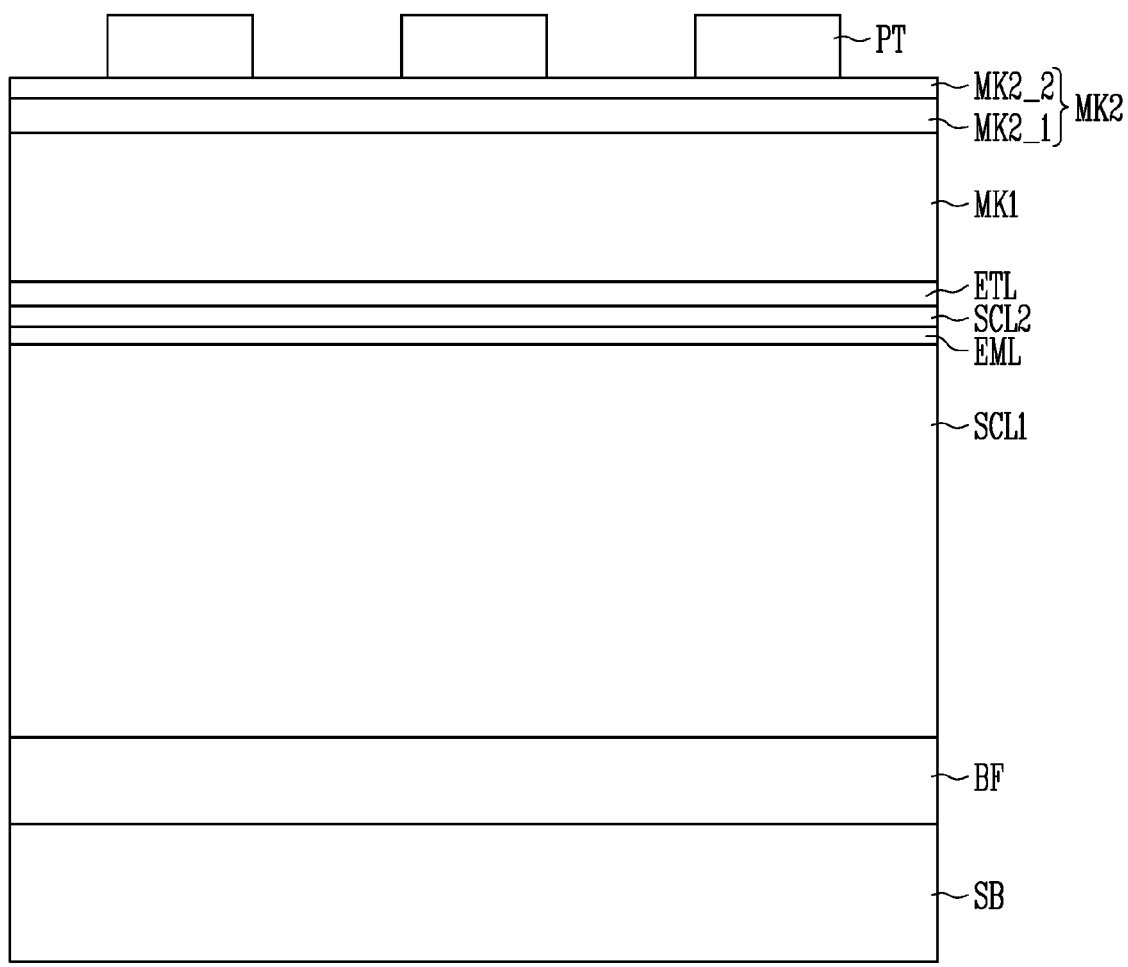
Figure 13:
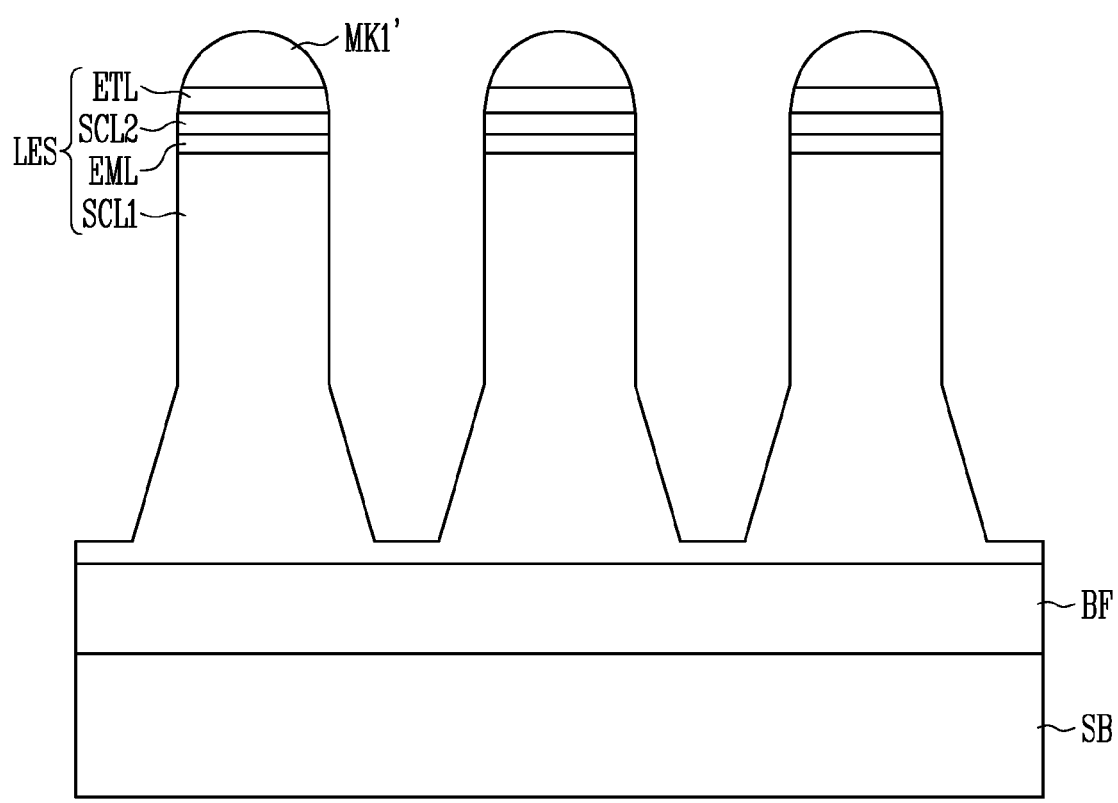
Figure 14:
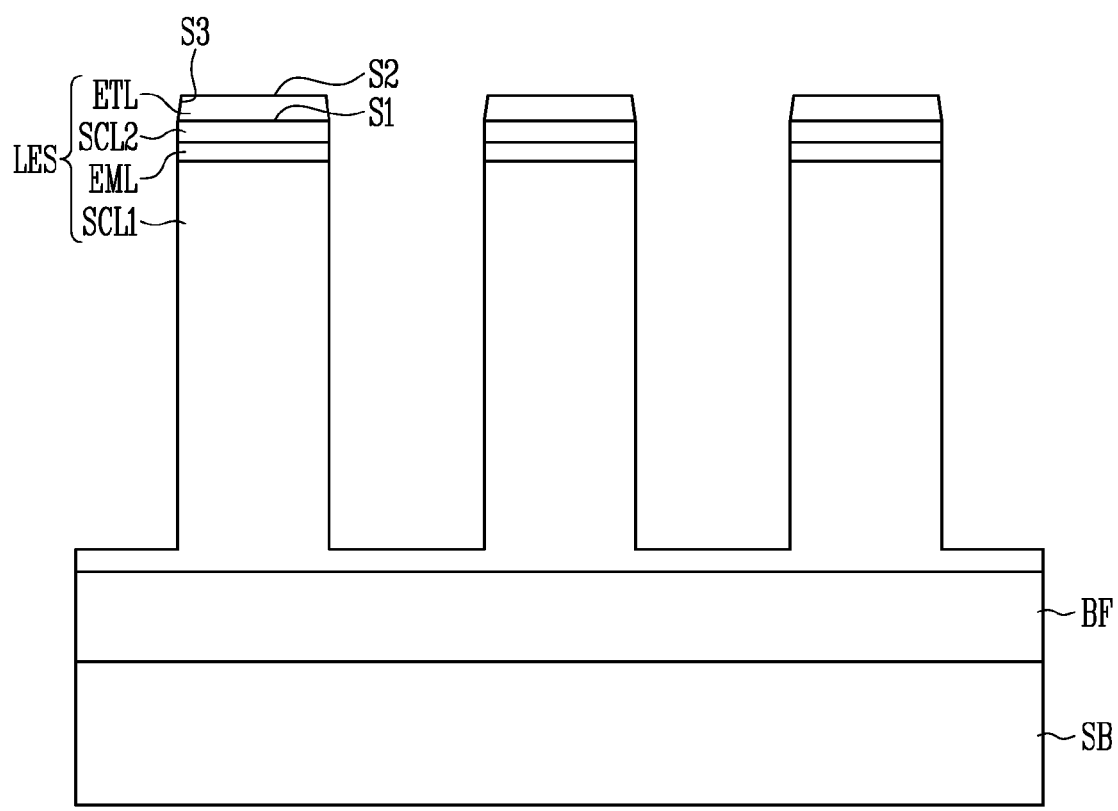

For example, as shown in FIG. 11, after forming a mask layer MK on the electrode layer ETL, as shown in FIG. 12, etching patterns PT (for example, nano patterns) may be formed on the mask layer MK. The stacked body LES including the first semiconductor layer SCL1, the emission layer EML, the second semiconductor layer SCL2, and the electrode layer ETL may be etched in a desired shape such as a rod shape by an etching process using the mask layer MK and the etching patterns PT. For example, the first semiconductor layer SCL1, the emission layer EML, the second semiconductor layer SCL2, and the electrode layer ETL are etched in a vertical direction thereof by performing a dry etching process using the mask layer MK and the etching patterns PT, so that as shown in FIG. 13, the stacked body LES including the first semiconductor layer SCL1, the emission layer EML, the second semiconductor layer SCL2, and the electrode layer ETL may be substantially etched in a rod shape. Thereafter, by performing an additional etching process (for example, a wet etching process, etc.), each of the primarily etched stacks LES may be patterned in a rod shape, as shown in FIG. 14.

In an embodiment, the mask layer MK may include at least two mask layers made of different materials for selective dry etching for each layer and/or each film to be performed in a subsequent process. For example, a first mask layer MK1 (for example, a first hard mask layer) including an insulating material may be first formed on the electrode layer ETL, and a second mask layer MK2 (for example, a second hard mask layer) including a conductive material may be formed on the first mask layer MK1.

The first mask layer MK1 may include a silicon oxide (SiOx) (for example, SiO2), a silicon nitride (SiNx), a silicon oxynitride (SiOxNy), or other insulating materials.

The second mask layer MK2 may include at least one metal of aluminum (Al), titanium (Ti), and chromium (Cr), or other metals. In an embodiment, the second mask layer MK2 may include multi-layered metal layers MK2_1 and MK2_2 including different metals. For example, the second mask layer MK2 may include a first metal layer MK2_1 including titanium (Ti) and a second metal layer MK2_2 including aluminum (Al). The material and stacked structure of the second mask layer MK2 are not particularly limited. For example, in case that a material may serve as a mask for successive etching of the first semiconductor layer SCL1, the emission layer EML, the second semiconductor layer SCL2, and the electrode layer ETL, it may be used as a material of the second mask layer MK2. The second mask layer MK2 may be formed of a single layer or multilayer. As the second mask layer MK2 is formed, the first mask layer MK1 may be protected in case that the etch patterns PT are removed in a subsequent process.

The etching patterns PT may be disposed to be spaced apart from each other on the mask layer MK. The etching patterns PT may be formed in a shape, size, and/or spacing corresponding to the light emitting elements LD in order to pattern respective light emitting elements LD on the substrate SB. For example, the etching patterns PT may have a shape and size corresponding to the shape and diameter D of the light emitting elements LD to be manufactured, and may be spaced apart from each other by a distance sufficient to readily separate the light emitting elements LD.

The etching patterns PT may include polymer, or other materials. In an embodiment, the etching patterns PT may include a nano-imprint resin, and may be formed by utilizing a nano-imprint lithography process technology.

In an embodiment, the first semiconductor layer SCL1, the emission layer EML, the second semiconductor layer SCL2, and the electrode layer ETL may be primarily etched by a stepwise dry etching process using the etching patterns PT. For example, after first etching the second mask layer MK2 by using the etching patterns PT, the first mask layer MK1 may be etched. After the first mask layer MK1 is etched, the electrode layer ETL, the second semiconductor layer SCL2, the emission layer EML, and the first semiconductor layer SCL1 may be sequentially etched. In an embodiment, the electrode layer ETL, the second semiconductor layer SCL2, the emission layer EML, and the first semiconductor layer SCL1 may be etched in a substantially vertical direction thereof by a dry etching process to have a substantial rod shape as shown in FIG. 13. A first mask pattern MK1' formed by etching the first mask layer MK1 in a pattern corresponding to the etching patterns PT may remain on the electrode layer ETL even after the dry etching process of the electrode layer ETL, the second semiconductor layer SCL2, the emission layer EML, and the first semiconductor layer SCL1 is completed.

Thereafter, an additional etching process such as a dry etching process may be performed to etch the stacked body LES including the first semiconductor layer SCL1, the emission layer EML, the second semiconductor layer SCL2, and the electrode layer ETL in a rod shape.

In an embodiment, the mask layer MK used in the patterning process of the first semiconductor layer SCL1, the emission layer EML, the second semiconductor layer SCL2, and the electrode layer ETL may be formed in a sufficient thickness to etch the electrode layer ETL so that the electrode layer ETL has a slope corresponding to an angle in a range of about 75° to about 90° on the side surface S3. The thickness of the mask layer MK (for example, the thickness of the first mask layer MK1 and/or the thickness of the second mask layer MK2) may be experimentally determined according to process conditions.

For example, the mask layer MK may be formed to have a thickness suitable for etching the electrode layer ETL or the like within a short time by increasing etching power so that the side surface S3 of the electrode layer ETL may have a steep slope of about 75° or more (for example, a slope in a range of about 80° to about 90°). For example, the mask layer MK may be formed to have a thickness of about 2 μm or more.

In an embodiment, the first mask layer MK1 may be formed to have a thickness of about 2 μm or more on the electrode layer ETL, and the second mask layer MK2 may be formed to have a thickness of about 160 nm or more on the first mask layer MK1 by using the material different from that of the first mask layer MK1. The electrode layer ETL may be readily etched so that the electrode layer ETL has a side slope corresponding to an angle in a range of about 75° to about 90°. For example, the electrode layer ETL may be etched so as to have a slope corresponding to an angle in a range of about 75° to about 90° with respect to the substrate SB (or the first surface S1 of the electrode layer ETL).

The mask layer MK, the etching patterns PT, and/or the first mask patterns MK1' may be removed after respective etching processes using them are completed.

Figure 15:
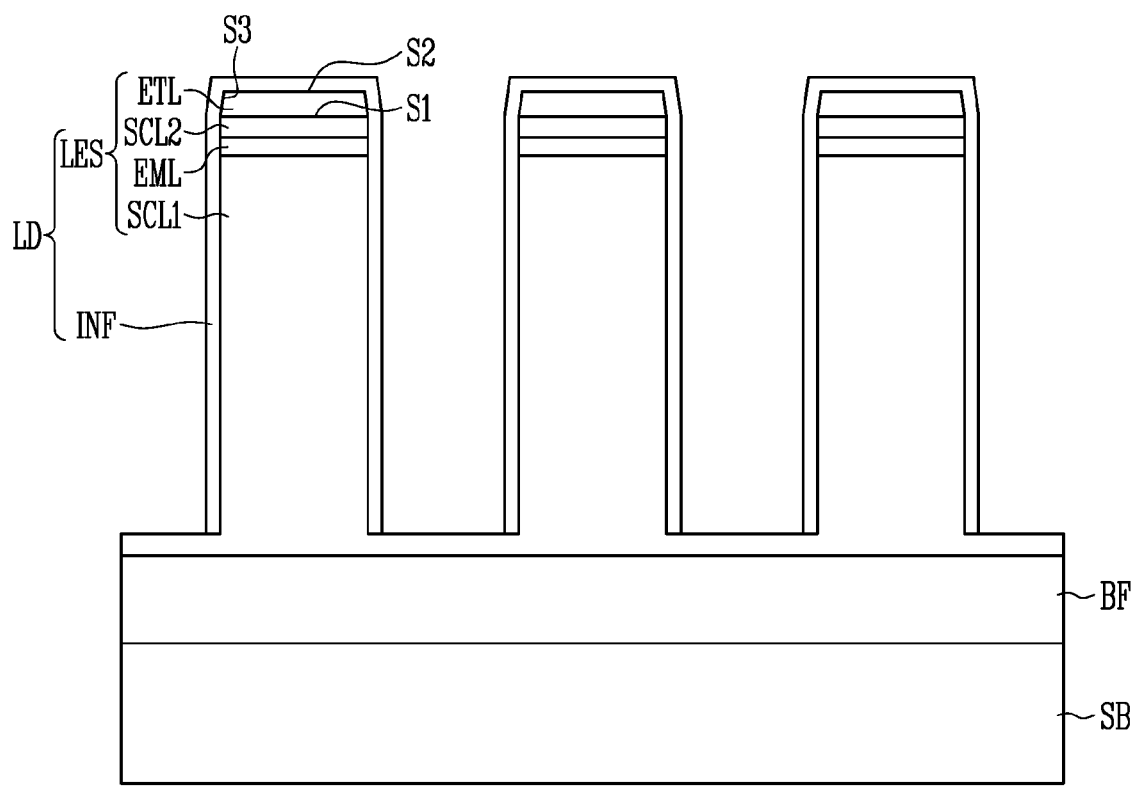

Referring to FIG. 15, the insulating film INF may be entirely formed on one surface or a surface (for example, the upper surface) of the substrate SB including the rod-shaped stacked bodies LES. In an embodiment, the insulating film INF may be made of the material of the insulating film INF described in an embodiment of FIG. 1 and FIG. 2 or other insulating materials. In an embodiment, the insulating film INF may be formed by utilizing an ALD process technique, a CVD process technique, or the like, but the method of forming the insulating film INF is not limited thereto.

Figure 16:
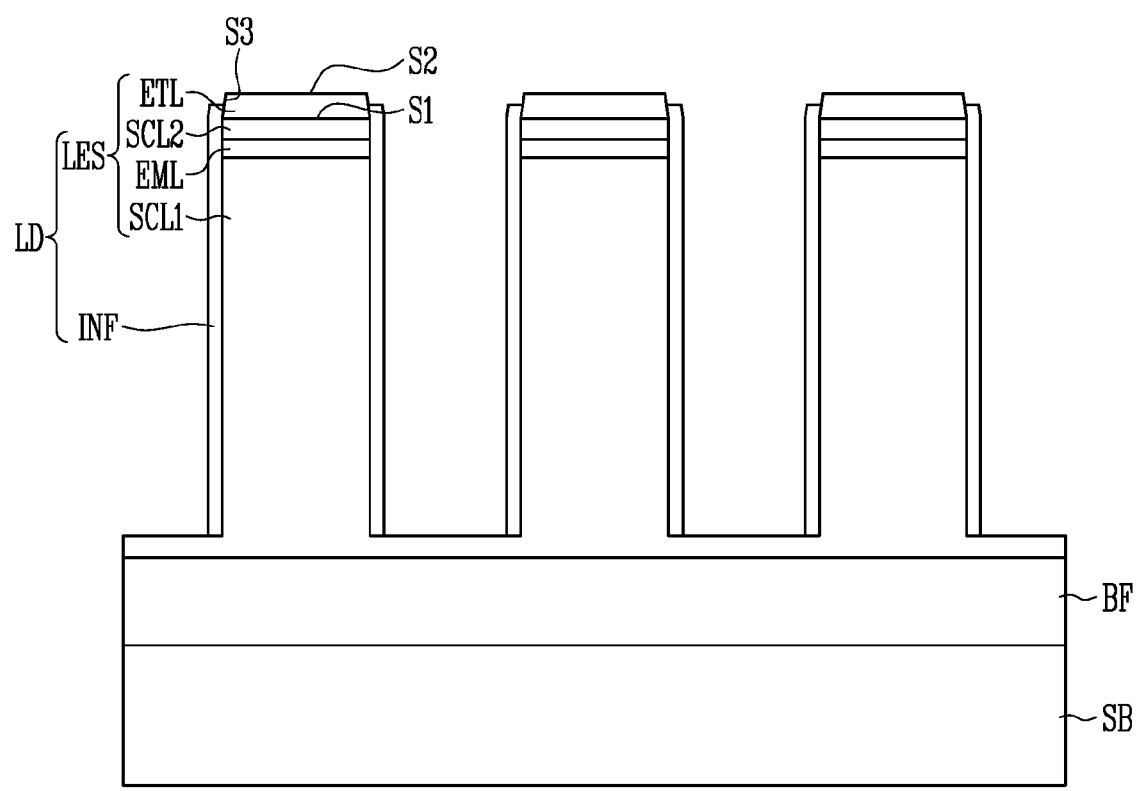

Referring to FIG. 16, the insulating film INF may be etched so that the second surface S2 of the electrode layer ETL is exposed. Accordingly, the insulating film INF may be formed on the side surface (for example, the side surfaces of the first semiconductor layer SCL1, the emission layer EML, the second semiconductor layer SCL2, and the electrode layer ETL forming each rod-type stacked body LES) of each of the rod-shaped stacked bodies LES, and the electrode layer ETL may be exposed on the upper surface of each of the stacked bodies LES. Accordingly, each light emitting element LD including each stacked body LES and the insulating film INF provided on the side surface of the stacked body LES may be manufactured.

In the process of etching the insulating film INF, the insulating film INF may be partially etched even on the side surface S3 of the electrode layer ETL. For example, the insulating film INF may be partially etched and removed from the upper portion of the side surface S3 of the electrode layer ETL.

In an embodiment, in case that the electrode layer ETL is formed such that the side surface S3 of the electrode layer ETL has a slope corresponding to an angle of a range of about 75° to about 90°, it is possible to prevent or minimize the etching of the insulating film INF on the side surface S3 of the electrode layer ETL during the process of etching the insulating film INF to expose the second surface S2 of the electrode layer ETL. Accordingly, in the area corresponding to the bonding surface of the electrode layer ETL and the second semiconductor layer SCL2 (for example, the area surrounding the first surface S1 of the electrode layer ETL or the periphery thereof), the insulating film INF may remain with a sufficient thickness. For example, in the area corresponding to the bonding surface of the electrode layer ETL and the second semiconductor layer SCL2, the insulating film INF may remain with a thickness of about 10 nm or more. Accordingly, the insulating film INF may stably surround the second semiconductor layer SCL2 or the like within the spirit and the scope of the disclosure.

Figure 17:
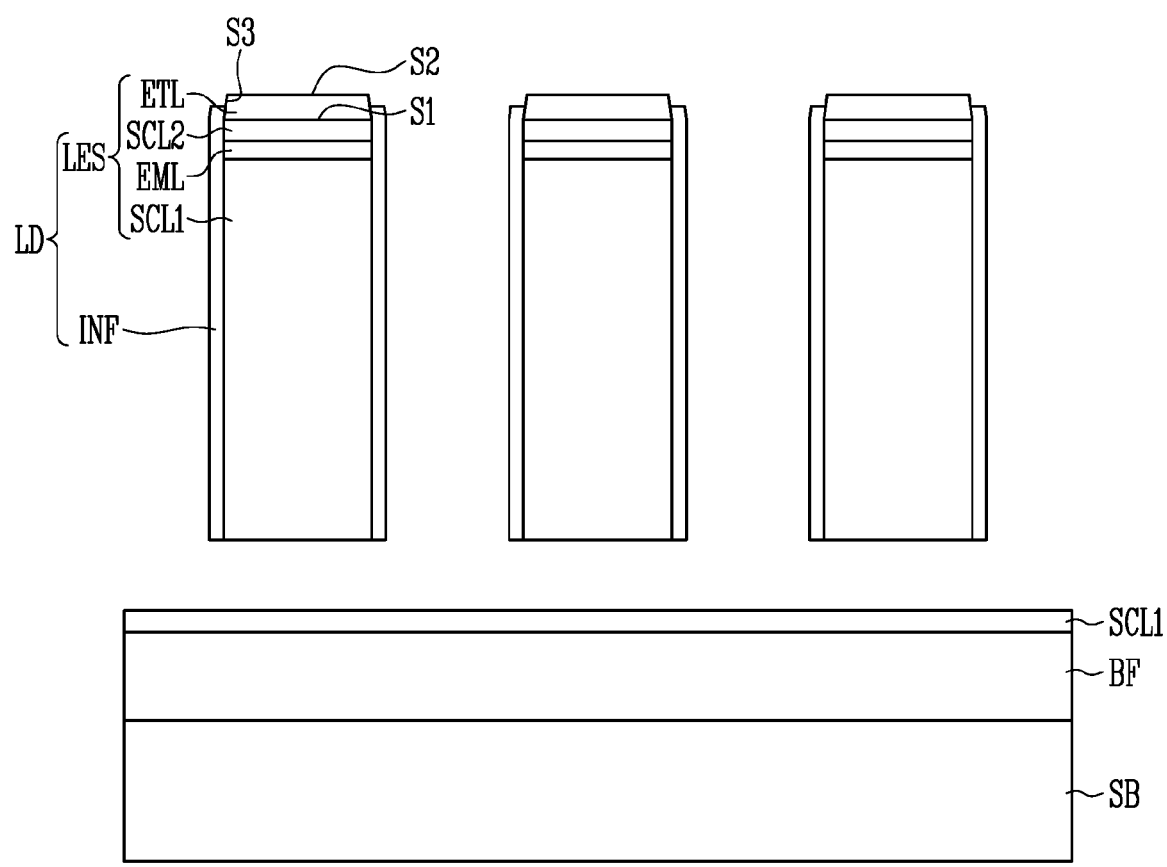

Referring to FIG. 17, the light emitting elements LD may be separated from the substrate SB. In an embodiment, the light emitting elements LD may be separated from the substrate SB by an electrical and/or chemical etching method, or other methods.

Figure 18:
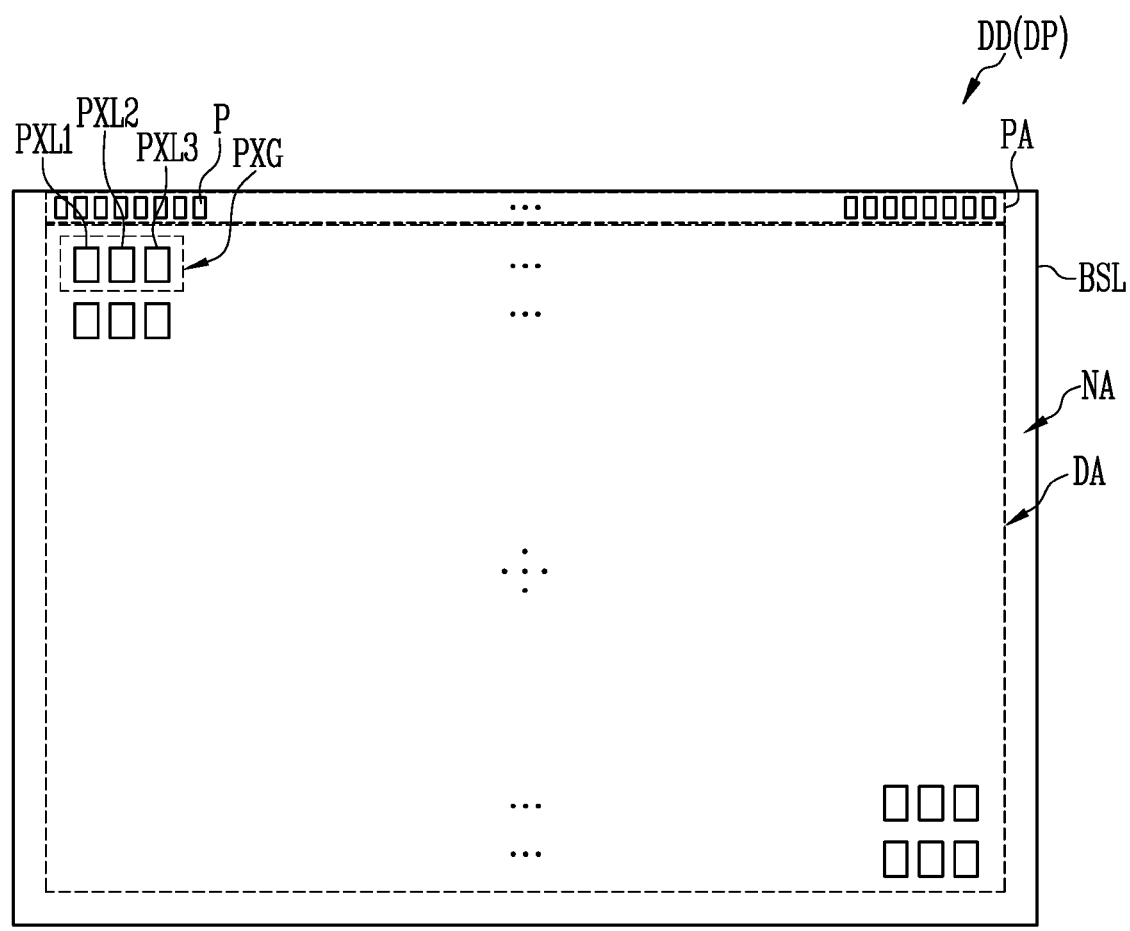
FIG. 18 illustrates a schematic top plan view of a display device according to an embodiment.

FIG. 18 illustrates a schematic top plan view of a display device DD according to an embodiment. FIG. 18 schematically illustrate a structure of the display device DD based on a display panel DP including a display area DA. The display device DD may further include a driving circuit (for example, a scan driver, a data driver, a timing controller, and the like) for driving pixels PXL.

Referring to FIG. 18, the display device DD may include a base layer BSL, and the pixels PXL disposed on the base layer BSL. The base layer BSL and the display device DD including the same may be provided in various shapes. For example, the base layer BSL and the display device DD may be provided in a plate shape having a substantially rectangular shape when viewed in a plan view, and may include angled or rounded corners. The shapes of the base layer BSL and the display device DD may be changed. For example, the base layer BSL and the display device DD may have polygonal shapes such as a hexagonal or octagonal shape when viewed in a plan view, or may have a shape including a curved line-type of circumference such as a circular or elliptical shape.

FIG. 18 illustrates the display device DD having a rectangular plate shape. A horizontal direction (for example, a row direction or a horizontal direction) of the display device DD is defined as a first direction DR1, a vertical direction (for example, a column direction or a vertical direction) of the display device DD is referred to as a second direction DR2, and a thickness direction (or a height direction) of the display device DD is referred to as a third direction DR3.

The base layer BSL may be a base member for forming the display device DD. For example, the base layer BSL may form a base surface of the display device DD.

The base layer BSL and the display device DD including the same may include a display area DA for displaying an image, and a non-display area NA positioned around the display area DA.

The display area DA may be an area in which the pixels PXL may be disposed, and may be an area in which an image may be displayed by the pixels PXL. In an embodiment, the display area DA may be disposed in the base layer BSL and a central area of the display device DD (for example, a central area of the display panel DP).

The display area DA may have various shapes. For example, the display area DA may have various shapes including a rectangular shape, a circular shape, or an elliptical shape. In an embodiment, the display area DA may have a shape corresponding to the shape of the base layer BSL, but is not limited thereto.

The non-display area NA may be an area excluding the display area DA. In an embodiment, the non-display area NA may be disposed in edge areas of the base layer BSL and the display device DD to surround or to be adjacent to the display area DA. A portion of the non-display area NA may be a pad area PA in which pads P are disposed.

The pixels PXL may be disposed in the display area DA. For example, the display area DA may include pixel areas in which respective pixels PXL are provided and/or disposed.

In an embodiment, at least two kinds of pixels PXL for emitting light of different colors may be disposed in the display area DA. For example, first color pixels PXL1, second color pixels PXL2, and third color pixels PXL3 may be arranged or disposed in the display area DA. At least one first color pixel PXL1, at least one second color pixel PXL2, and at least one third color pixel PXL3 disposed to be adjacent to each other may form one pixel group PXG. By individually controlling the luminance of the first, second, and third color pixels PXL1, PXL2, and PXL3 in each pixel group PXG, the color of the light emitted from the pixel group PXG may be variously changed.

In an embodiment, the first color pixel PXL1, the second color pixel PXL2, and the third color pixel PXL3 sequentially arranged or disposed along the first direction DR1 may form one pixel group PXG. The number, type, and/or mutual disposition structure of the pixels PXL forming each pixel group PXG may be variously changed.

In an embodiment, the first color pixel PXL1 may be a red pixel for emitting red light, and the second color pixel PXL2 may be a green pixel for emitting green light. The third color pixel PXL3 may be a blue pixel for emitting blue light. The color of the light emitted from the pixels PXL forming each pixel group PXG may be variously changed.

In an embodiment, each pixel PXL may include at least one light emitting element LD. For example, the pixel PXL may include the light emitting element LD according to at least one embodiment among embodiments of FIG. 1 to FIG. 7. For example, the pixel PXL may include the light emitting element LD including the first semiconductor layer SCL1, the emission layer EML, the second semiconductor layer SCL2, the electrode layer ETL, and the insulating film INF, and the electrode layer ETL may include the side surface S3 having a slope of about 75° to 90°. In an embodiment, each light emitting element LD may have a size in a range of approximately nanometers to micrometers and may have a rod shape, but is not limited thereto. For example, the number, type, structure, and/or size of the light emitting elements LD provided to each pixel PXL may be changed according to embodiments.

In an embodiment, the first color pixel PXL1, the second color pixel PXL2, and the third color pixel PXL3 may be respectively provided with light emitting elements LD of the first color, the second color, and the third color as a light source. Accordingly, the first color pixel PXL1, the second color pixel PXL2, and the third color pixel PXL3 may emit light of the first color, light of the second color, and light of the third color, respectively.

In an embodiment, the first color pixel PXL1, the second color pixel PXL2, and the third color pixel PXL3 may include light emitting elements LD that emit light of a same color as each other, and a light converting layer including wavelength converting particles (for example, particles that convert the color and/or wavelength of light, such as quantum dots QD) may be disposed in a light emitting area of the first color pixel PXL1, the second color pixel PXL2, and/or the third color pixel PXL3. Accordingly, the first color pixel PXL1, the second color pixel PXL2, and the third color pixel PXL3 may emit light of the first color, light of the second color, and light of the third color, respectively.

For example, the first color pixel PXL1, the second color pixel PXL2, and the third color pixel PXL3 include blue light emitting elements, but a light converting layer including wavelength converting particles (for example, red quantum dots) of the first color may be disposed in the light emitting area of the first color pixel PXL1, and a light converting layer including wavelength converting particles (for example, green quantum dots) of the second color may be disposed in the light emitting area of the second color pixel PXL2. Accordingly, the first color pixel PXL1 may emit light of the first color (for example, red light), and the second color pixel PXL2 may emit light of the second color (for example, green light).

The pixels PXL may have a structure according to at least one of embodiments to be described below. For example, the pixels PXL may have a structure to which one of embodiments to be described later is applied, or a structure to which at least two embodiments are applied in combination.

In an embodiment, the pixel PXL may be formed as an active pixel, but is not limited thereto. For example, in an embodiment, the pixel PXL may be formed as a passive pixel.

In the non-display area NA, wires connected to the pixels PXL of the display area DA, and/or internal circuit parts may be disposed. A portion of the non-display area NA may be set as the pad area PA, and the pads P may be disposed to the pad area PA. The pads P may include signal pads and/or power pads to which various driving signals and/or powers necessary for driving the pixels PXL are applied.

In an embodiment, the non-display area NA may have a narrow width. For example, the non-display area NA may have a width of about 100 μm or less. Accordingly, the display device DD may be implemented as a bezel-less display device.

Figure 19:
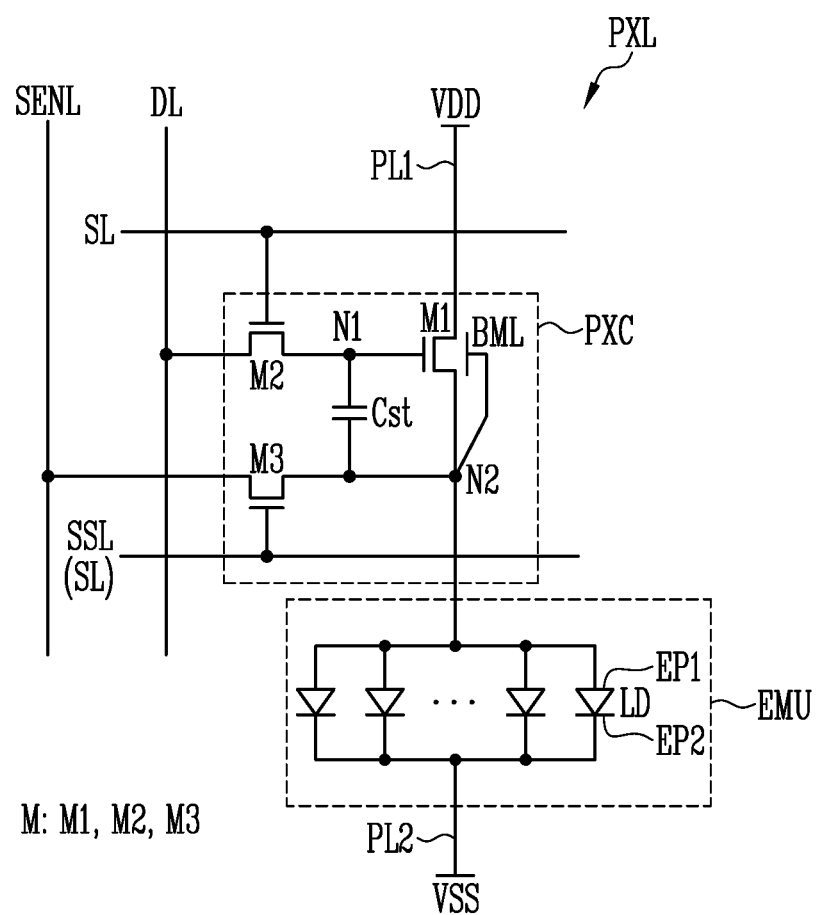
FIG. 19 and FIG. 20 respectively illustrate schematic diagrams of equivalent circuits of a pixel according to an embodiment.
Figure 20:
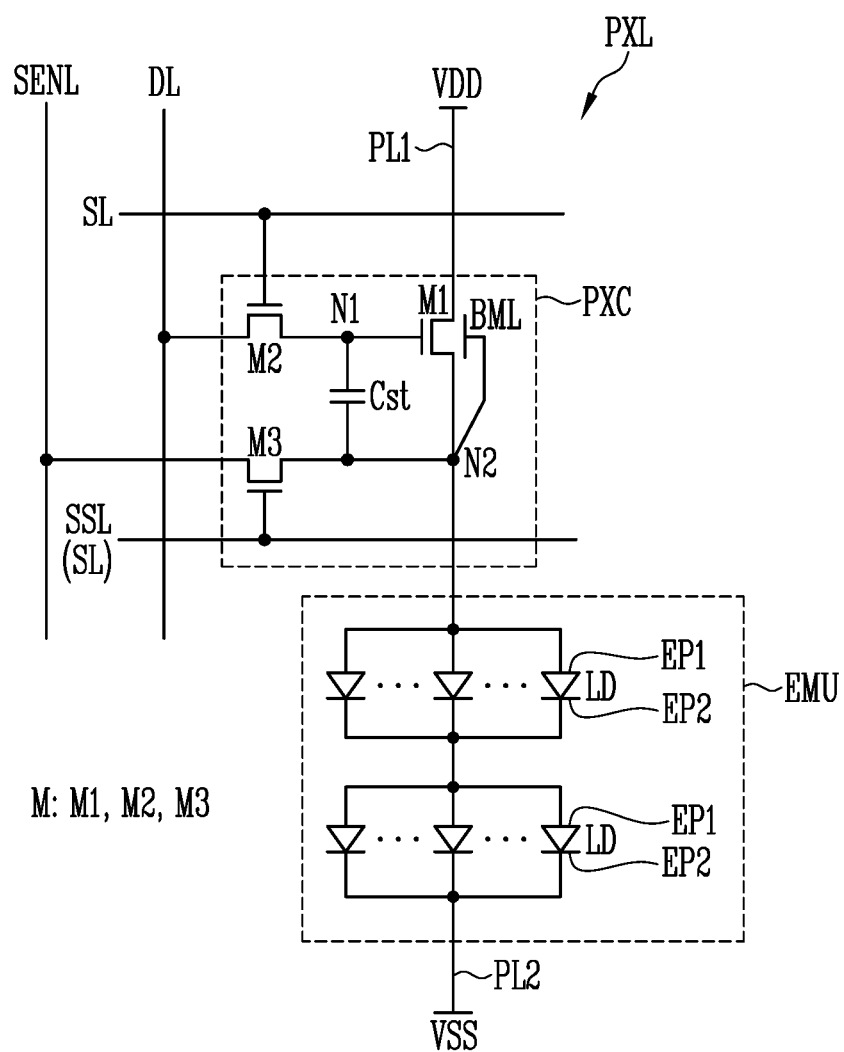

FIG. 19 and FIG. 20 respectively illustrate a schematic diagrams of equivalent circuits of the pixel PXL according to an embodiment. For example, FIG. 19 and FIG. 20 illustrate the pixels PXL including light emitting parts EMU having different structures.

In an embodiment, each pixel PXL illustrated in FIG. 19 and FIG. 20 may be one of the pixels PXL disposed in the display area DA of FIG. 18. The pixels PXL may have substantially the same or similar structure to each other.

Referring to FIG. 19 and FIG. 20, the pixel PXL may be connected to a scan line SL (also referred to as a "first scan line"), a data line DL, a first power line PL1, and a second power line PL2. The pixel PXL may be further connected to at least one other power line and/or signal line. For example, the pixel PXL may be further connected to a sensing line SENL (also referred to an "initialization power line") and/or a control line SSL (also referred to as a "second scan line").

The pixel PXL may include the light emitting part EMU for generating light of luminance corresponding to each data signal. The pixel PXL may further include a pixel circuit PXC for driving the light emitting part EMU.

The pixel circuit PXC may be connected to the scan line SL and the data line DL, and may be connected between the first power line PL1 and the light emitting part EMU. For example, the pixel circuit PXC may be electrically connected to the scan line SL to which a first scan signal is supplied, the data line DL to which a data signal is supplied, the first power line PL1 to which a voltage of a first power source VDD is applied, and the light emitting part EMU.

The pixel circuit PXC may be selectively further connected to the control line SSL to which a second scan signal is supplied, and the sensing line SENL connected to a reference power source (or initialization power source) or a sensing circuit in response to a display period or sensing period. In an embodiment, the second scan signal may be the same as or different from the first scan signal. In case that the second scan signal is the same signal as the first scan signal, the control line SSL may be integrated with the scan line SL.

The pixel circuit PXC may include at least one transistor M and a capacitor Cst. For example, the pixel circuit PXC may include a first transistor M1, a second transistor M2, a third transistor M3, and the capacitor Cst.

The first transistor M1 may be connected between the first power line PL1 and a second node N2. The second node N2 may be a node at which the pixel circuit PXC and the light emitting part EMU are connected to each other. For example, the second node N2 may be a node in which one electrode (for example, a source electrode) of the first transistor M1 and the light emitting part EMU are electrically connected to each other. A gate electrode of the first transistor M1 may be connected to a first node N1. The first transistor M1 may control a driving current supplied to the light emitting part EMU in response to a voltage of the first node N1. For example, the first transistor M1 may be a driving transistor of the pixel PXL.

In an embodiment, the first transistor M1 may further include a bottom metal layer BML (also referred to as "back gate electrode" or "second gate electrode"). In an embodiment, the bottom metal layer BML may be connected to one electrode (for example, a source electrode) of the first transistor M1.

In an embodiment in which the first transistor M1 may include the bottom metal layer BML, by applying a back-biasing voltage to the bottom metal layer BML of the first transistor M1, a back-biasing technique (or a sync technique) of moving a threshold voltage of the first transistor M1 in a negative or positive direction may be applied. In case that the bottom metal layer BML is disposed under or below a semiconductor pattern (for example, the semiconductor pattern SCP of FIG. 22) forming a channel of the first transistor M1, it may block the light incident on the semiconductor pattern to stabilizes operating characteristics of the first transistor M1.

The second transistor M2 may be connected between the data line DL and the first node N1. A gate electrode of the second transistor M2 may be connected to a scan line SL. In case that a first scan signal of a gate-on voltage (for example, a logic high voltage or a high level voltage) is supplied from the scan line SL, the second transistor M2 may be turned on to connect the data line DL and the first node N1.

For each frame period, a data signal of the corresponding frame may be supplied to the data line DL, and the data signal may be transmitted to the first node N1 through the second transistor M2 during a period in which the first scan signal of the gate-on voltage is supplied. For example, the second transistor M2 may be a switching transistor for transmitting each data signal to the inside of the pixel PXL.

A first electrode of the capacitor Cst may be connected to the first node N1, and the second electrode of the capacitor Cst may be connected to the second node N2. The capacitor Cst may be charged with a voltage corresponding to the data signal supplied to the first node N1 during each frame period.

The third transistor M3 may be connected between the second node N2 and the sensing line SENL. A gate electrode of the third transistor M3 may be connected to the control line SSL (or the scan line SL). The third transistor M3 may be turned on in case that the second scan signal (or first scan signal) of a gate-on voltage (for example, a logic high voltage or high level voltage) is supplied from the control line SSL to transmit the reference voltage (or initialization voltage) supplied to the sensing line SENL to the second node N2 or to transmit the voltage of the second node N2 to the sensing line SENL. In an embodiment, the voltage of the second node N2 may be transmitted to the sensing circuit through the sensing line (SENL), and may be provided to the driving circuit (for example, timing controller) to be used for compensating the characteristic deviation of the pixels PXL.

In FIG. 19 and FIG. 20, all of the transistors M included in the pixel circuit PXC are illustrated as N-type transistors, but embodiments are not limited thereto. For example, at least one of the first, second, and third transistors M1, M2, and M3 may be changed to a P-type transistor. The structure and driving method of the pixel PXL may be variously changed according embodiments.

The light emitting part EMU may include at least one light emitting element LD. In an embodiment, the light emitting part EMU may include a single light emitting element LD connected in a forward direction between the first power source VDD and the second power source VSS. In an embodiment, the light emitting part EMU may include light emitting elements LD that are connected in a forward direction between the first power source VDD and the second power source VSS. At least one light emitting element LD connected to in a forward direction between the first power source VDD and the second power source VSS may form an effective light source of the pixel PXL.

In an embodiment, the light emitting part EMU may include the light emitting elements LD connected in parallel between the pixel circuit PXC and the second power line PL2 as in an embodiment of FIG. 19. The first end portions EP1 of the light emitting elements LD may be electrically connected to the pixel circuit PXC, and may be electrically connected to the first power line PL1 through the pixel circuit PXC. The second end portions EP2 of the light emitting elements LD may be electrically connected to the second power line PL2. A voltage of the second power source VSS may be applied to the second power line PL2.

The number, type, and/or structure of the light emitting elements LD forming the effective light source of the pixel PXL may be changed according to embodiments. The arrangement and/or connection structure of the light emitting elements LD may also be changed according to embodiments.

In an embodiment, the light emitting part EMU may include the light emitting elements LD connected in parallel-series between the pixel circuit PXC and the second power line PL2 as in an embodiment of FIG. 20. For example, the light emitting elements LD may be arranged or disposed and/or connected to at least two serial stages between the pixel circuit PXC and the second power line PL2, and each serial stage may include at least one light emitting element LD connected in a forward direction between the first power source VDD and the second power source VSS.

The first power source VDD and the second power source VSS may have different potentials. For example, the first power source VDD may be a high potential pixel power source, and the second power source VSS may be a low potential pixel power source. A potential difference between the first power source VDD and the second power source VSS may be greater than or equal to a threshold voltage of the light emitting elements LD.

The light emitting elements LD may emit light with luminance corresponding to a driving current supplied through the pixel circuit PXC. During each frame period, the pixel circuit PXC may supply a driving current corresponding to the data signal to the light emitting part EMU. The driving current supplied to the light emitting part EMU may flow through the light emitting elements LD to cause the light emitting elements LD to emit light. Accordingly, the light emitting part EMU may emit light with a luminance corresponding to the driving current.

FIG. 19 and FIG. 20 illustrate only light emitting elements LD (that is, effective light sources) connected in a forward direction between the first power source VDD and the second power source VSS, but embodiments are not limited thereto. For example, the light emitting part EMU may further include at least one ineffective light source in addition to the light emitting elements LD forming each effective light source. For example, the light emitting part EMU may further include at least one ineffective light emitting element arranged or disposed in a reverse direction between the first power source VDD and the second power source VSS, or having at least one end portion of which is floating.

Figure 21:
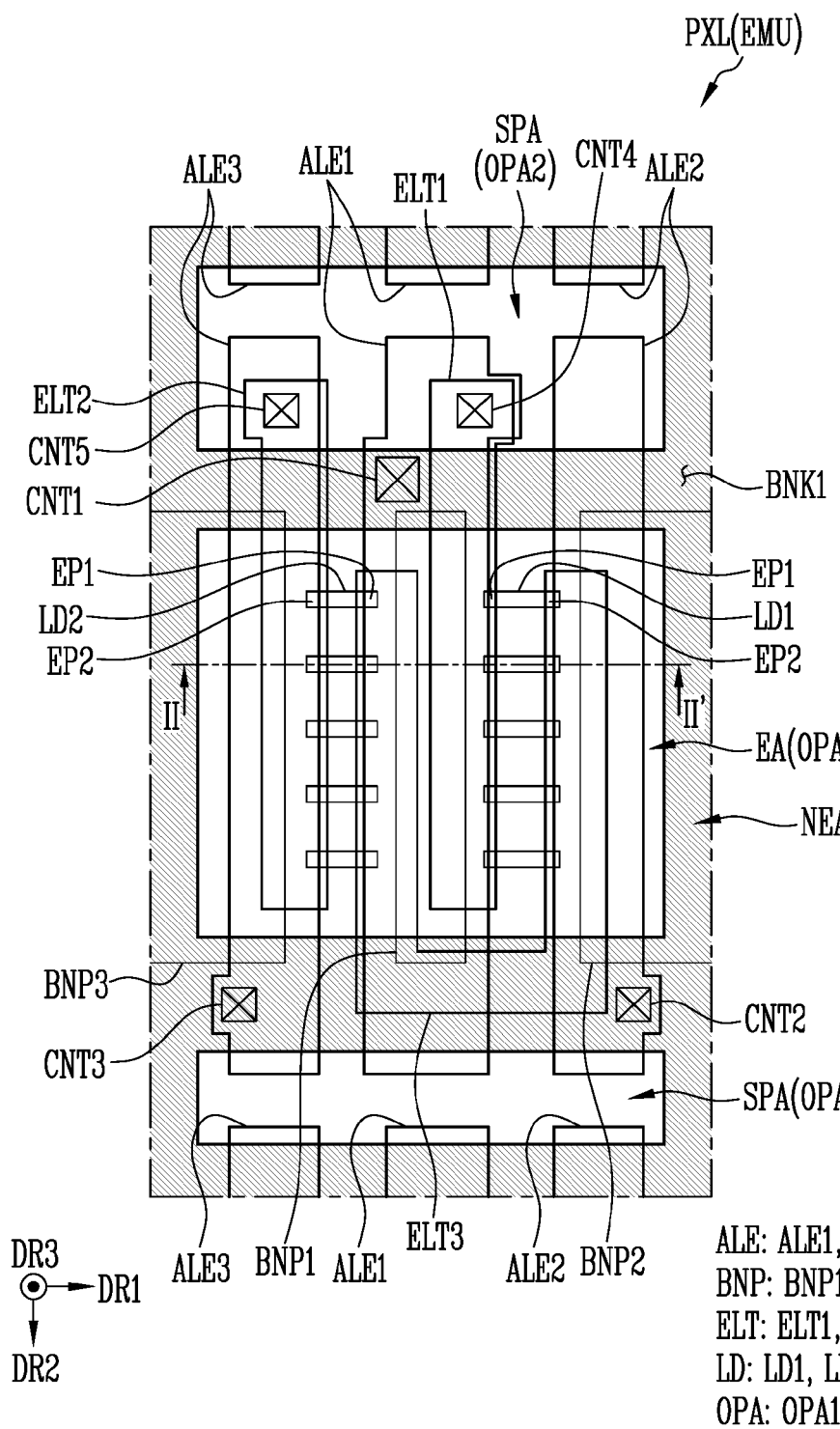
FIG. 21 illustrates a schematic top plan view of a pixel according to an embodiment.

FIG. 21 illustrates a schematic top plan view of a pixel PXL according to an embodiment. For example, FIG. 21 illustrates a structure of the pixel PXL based on the light emitting part EMU, and illustrates an embodiment of the light emitting part EMU including the light emitting elements LD that are connected in series-parallel to each other as in an embodiment of FIG. 20.

Referring to FIG. 1 to FIG. 21, the pixel PXL may include a light emitting area EA in which at least one light emitting element LD is disposed. In an embodiment, the light emitting area EA may include at least two light emitting elements LD, and electrodes electrically connected to the light emitting elements LD. In an embodiment, the electrodes may include alignment electrodes ALE and pixel electrodes ELT (also referred to as "contact electrodes"). The pixel PXL may further include bank patterns BNP disposed under or below the alignment electrodes ALE.

The alignment electrodes ALE may have various shapes, and may be spaced apart from each other. In an embodiment, the alignment electrodes ALE may be spaced apart from each other along the first direction DR1, and each thereof may have an extended shape (for example, a bar shape) along the second direction DR2.

The shape, size, number, position, and/or mutual disposition structure of the alignment electrodes ALE may be variously changed according to embodiments. The alignment electrodes ALE may have a shape and/or size similar to or the same as each other, or may have different shapes and sizes.

The alignment electrodes ALE may include at least two electrodes spaced apart from each other. For example, the alignment electrodes ALE may include a first alignment electrode ALE1 and a second alignment electrode ALE2, and may optionally further include a third alignment electrode ALE3.

In an embodiment, the first alignment electrode ALE1 may be positioned at a center of the light emitting area EA, and the second alignment electrode ALE2 and the third alignment electrode ALE3 may be disposed at both sides of the first alignment electrode ALE1. For example, the second alignment electrode ALE2 may be disposed at the right side of the first alignment electrode ALE1, and the third alignment electrode ALE3 may be disposed at the left side of the first alignment electrode ALE1.

The alignment electrodes ALE (or, alignment lines before being separated into the alignment electrodes ALE of each of the pixels PXL) may receive alignment signals necessary for aligning the light emitting elements LD in an aligning step of the light emitting elements LD. Accordingly, an electric field is formed between the alignment electrodes ALE, so that the light emitting elements LD may be aligned and/or arranged or disposed between the alignment electrodes ALE. Here, in case that the light emitting elements LD are aligned and/or arranged or disposed between the alignment electrodes ALE, it means that at least a portion of each of the light emitting elements LD is disposed between the alignment electrodes ALE.

For example, the first alignment electrode ALE1, the second alignment electrode ALE2, and the third alignment electrode ALE3 (or a first alignment line in which the first alignment electrodes ALE1 of the pixels PXL are connected, a second alignment line in which the second alignment electrodes ALE2 of the pixels PXL are connected, and a third alignment line in which the third alignment electrodes ALE3 of the pixels PXL are connected) may receive a first alignment signal, a second alignment signal, and a third alignment signal in the aligning step of the light emitting elements LD, respectively. The first alignment signal and the second alignment signal may have different waveforms, potentials, and/or phases. Accordingly, an electric field is formed between the first alignment electrode ALE1 and the second alignment electrode ALE2, so that the light emitting elements LD (for example, first light emitting elements LD1) may be aligned between the first alignment electrode ALE1 and the second alignment electrode ALE2. The first alignment signal and the third alignment signal may have different waveforms, potentials, and/or phases. Accordingly, an electric field is formed between the first alignment electrode ALE1 and the third alignment electrode ALE3, so that the light emitting elements LD (for example, second light emitting elements LD2) may be aligned between the first alignment electrode ALE1 and the third alignment electrode ALE3. The third alignment signal may be the same as or different from the second alignment signal.

The alignment electrodes ALE may be disposed in the light emitting area EA of each pixel PXL. In an embodiment, the alignment electrodes ALE may extend to a separation area SPA past the non-light emitting area NEA around the light emitting area EA. The separation area SPA may be an area in which each alignment line (for example, the first alignment line, the second alignment line, or the third alignment line) is separated into the alignment electrodes ALE (for example, the first alignment electrodes ALE1, the second alignment electrodes ALE2, or the third alignment electrodes ALE3) of the pixels PXL) of the pixels PXL after alignment of the light emitting elements LD is completed, and may be disposed on at least one side or a side of each light emitting area EA.

For example, each pixel PXL has at least one separation area SPA disposed around the light emitting area EA (for example, two separation areas SPA disposed above and below each light emitting area EA). End portions of at least one electrode forming the light emitting part EMU (for example, end portions of the alignment electrodes ALE) may be disposed in each separation area SPA.

In an embodiment, each alignment electrode ALE may have a separated pattern for each pixel PXL. For example, the first, second, and third alignment electrodes ALE1, ALE2, and ALE3 of each of the pixels PXL may respectively have an individually separated pattern.

However, the disclosure is not limited thereto. For example, in a structure in which the second pixel electrodes ELT2 of the pixels PXL are commonly connected to the second power line PL2, the alignment electrodes ALE (for example, the third alignment electrodes ALE3 of the pixels PXL) connected to the second pixel electrodes ELT2 are integrated with each other without being disconnected between the pixels PXL adjacent to each other along the first direction DR1 and/or the second direction DR2.

In an embodiment, the first alignment electrode ALE1 may be electrically connected to the pixel circuit PXC (for example, the pixel circuit PXC of the corresponding pixel PXL) positioned in the circuit layer (for example, the circuit layer PCL of FIG. 22) and/or the first power line PL1 through a first contact portion CNT1. The first alignment signal may be supplied to the first alignment electrode ALE1 (or the first alignment wire) through at least one wire (for example, the first power line PL1) positioned in the circuit layer.

The first contact portion CNT1 may include at least one contact hole and/or via hole. In an embodiment, the first contact portion CNT1 may be positioned in the non-light emitting area NEA positioned around each light emitting area EA, but the position of the first contact portion CNT1 may be changed. For example, the first contact portion CNT1 may be disposed to each light emitting area EA or separation area SPA.

In an embodiment, the second alignment electrode ALE2 may be electrically connected to the second power line PL2 positioned in the circuit layer through a second contact portion CNT2. The second alignment signal may be supplied to the second alignment electrode ALE2 (or the second alignment wire) through the second power line PL2.

Similarly, the third alignment electrode ALE3 may be electrically connected to the second power line PL2 positioned in the circuit layer through a third contact portion CNT3. The second alignment signal may also be supplied to the third alignment electrode ALE3 (or the third alignment wire) through the second power line PL2.

The second contact portion CNT2 and the third contact portion CNT3 may each include at least one contact hole and/or via hole. In an embodiment, the second contact portion CNT2 and the third contact portion CNT3 may be positioned in the non-light emitting area NEA positioned around each light emitting area EA, but the positions of the second contact portion CNT2 and the third contact portion CNT3 may be changed. For example, the second contact portion CNT2 and the third contact portion CNT3 may be disposed to each light emitting area EA or separation area SPA.

At least one first light emitting element LD1 may be dispose between the first alignment electrode ALE1 and the second alignment electrode ALE2. For example, first light emitting elements LD1 may be arranged or disposed between the first alignment electrode ALE1 and the second alignment electrode ALE2.

Each of the first light emitting elements LD1 may or may not overlap the first alignment electrode ALE1 and/or the second alignment electrode ALE2. The first end portion EP1 of the first light emitting element LD1 may be disposed to be adjacent to the first alignment electrode ALE1, and the second end portion EP2 of the first light emitting element LD1 may be disposed to be adjacent to the second alignment electrode ALE2.

The first end portion EP1 of the first light emitting element LD1 may be electrically connected to the first pixel electrode ELT1. In an embodiment, the first end EP1 of the first light emitting element LD1 may be electrically connected to the first alignment electrode ALE1 through the first pixel electrode ELT1, and may be electrically connected to the pixel circuit PXC and/or the first power line PL1 through the first alignment electrode ALE1.

The second end portion EP2 of the first light emitting element LD1 may be electrically connected to the third pixel electrode ELT3 and/or the second pixel electrode ELT2. In an embodiment, the second end portion EP2 of the first light emitting element LD1 may be electrically connected to the third pixel electrode ELT3. The second end portion EP2 of the first light emitting element LD1 may be electrically connected to the second power line PL2 sequentially via the third pixel electrode ELT3, at least one second light emitting element LD2, the second pixel electrode ELT2, and the third alignment electrode ALE3.

At least one second light emitting element LD2 may be disposed between the first alignment electrode ALE1 and the third alignment electrode ALE3. For example, second light emitting elements LD2 may be arranged or disposed between the first alignment electrode ALE1 and the third alignment electrode ALE3.

Each of the second light emitting elements LD2 may or may not overlap the first alignment electrode ALE1 and/or the third alignment electrode ALE3. The first end portion EP1 of the second light emitting element LD2 may be disposed to be adjacent to the first alignment electrode ALE1, and the second end portion EP2 of the second light emitting element LD2 may be disposed to be adjacent to the third alignment electrode ALE3.

The first end portion EP1 of the second light emitting element LD2 may be electrically connected to the third pixel electrode ELT3. The second end portion EP2 of the second light emitting element LD2 may be electrically connected to the second pixel electrode ELT2. In an embodiment, the second end portion EP2 of the second light emitting element LD2 may be electrically connected to the third alignment electrode ALE3 through the second pixel electrode ELT2, and may be electrically connected to the second power line PL2 through the third alignment electrode ALE3.

For example, each light emitting element LD (for example, each first light emitting element LD1 or second light emitting element LD2) may include the first end portion EP1 electrically connected to the first pixel electrode ELT1 and the second end portion EP2 electrically connected to the second pixel electrode ELT2. In an embodiment, each light emitting element LD may be an ultra-small inorganic light emitting element using a material having an inorganic crystalline structure (for example, having a small size in a range of nanometers to micrometers). For example, each light emitting element LD may be an ultra-small inorganic light emitting element manufactured by growing a nitride-based semiconductor or a phosphide-based semiconductor.

However, the type, size, shape, structure, and/or number of light emitting elements LD forming each light emitting part EMU may be changed.

The light emitting elements LD may be dispersed in a solution to be prepared in a form of a light emitting element mixture solution (or light emitting element ink), and may be supplied to each light emitting area EA by an inkjet method or a slit coating method. In case that the alignment signals are applied to the alignment electrodes ALE (or alignment lines) of the pixels PXL simultaneously with or after the supply of the light emitting elements LD, an electric field may be formed between the alignment electrodes ALE so that the light emitting elements LD may be aligned. After the alignment of the light emitting elements LD is completed, the solvent may be removed through a drying process.

The first pixel electrode ELT1 (also referred to as a "first electrode") may be disposed on the first end portions EP1 of the first light emitting elements LD1, and may be electrically connected to the first end portions EP1 of the first light emitting elements LD1. As an example, the first pixel electrode ELT1 may be disposed on or directly disposed on the first end portions EP1 of the first light emitting elements LD1 to be in contact with the first end portions EP1 of the first light emitting elements LD1.

In an embodiment, the first pixel electrode ELT1 may overlap the first alignment electrode ALE1, and may be electrically connected to the first alignment electrode ALE1 through a fourth contact portion CNT4. The first pixel electrode ELT1 may be electrically connected to the pixel circuit PXC and/or the first power line PL1 through the first alignment electrode ALE1. In an embodiment, the first pixel electrode ELT1 may be electrically connected to the pixel circuit PXC and/or the first power line PL1 without through the first alignment electrode ALE1.

The third pixel electrode ELT3 may be disposed on the second end portions EP2 of the first light emitting elements LD1 and the first end portions EP1 of the second light emitting elements LD2, and may be electrically connected to the second end portions EP2 of the first light emitting elements LD1 and the first end portions EP1 of the second light emitting elements LD2. For example, the third pixel electrode ELT3 may be disposed on or directly disposed on the second end portions EP2 of the light emitting elements LD1 and the first end portions EP1 of the second light emitting elements LD2 to be in contact with the second end portions EP2 of the first light emitting elements LD1 and the first end portions EP1 of the second light emitting elements LD2. The third pixel electrode ELT3 may be a middle electrode for electrically connecting the first light emitting elements LD1 and the second light emitting elements LD2. In an embodiment, the third pixel electrode ELT3 may overlap a portion of each of the first and second alignment electrodes ALE1 and ALE2, but is not limited thereto.

The second pixel electrode ELT2 (also referred to as a "second electrode") may be disposed on the second end portions EP2 of the second light emitting elements LD2, and may be electrically connected to the second end portions EP2 of the second light emitting elements LD2. As an example, the second pixel electrode ELT2 may be disposed on or directly disposed on the second end portions EP2 of the second light emitting elements LD2 to be in contact with the second end portions EP2 of the second light emitting elements LD2.

In an embodiment, the second pixel electrode ELT2 may overlap the third alignment electrode ALE3, and may be electrically connected to the third alignment electrode ALE3 through a fifth contact portion CNT5. The second pixel electrode ELT2 may be electrically connected to the second power line PL2 through the third alignment electrode ALE3. In an embodiment, the second pixel electrode ELT2 may be electrically connected to the second power line PL2 without passing through the third alignment electrode ALE3.

The pixel electrodes ELT (for example, the first pixel electrode ELT1, the second pixel electrode ELT2, and the third pixel electrode ELT3) may be formed separately from each other in each light emitting area EA. In an embodiment, at least one pixel electrode ELT may extend from each light emitting area EA to the non-light emitting area NEA and/or the separation area SPA. For example, the first pixel electrode ELT1 and the second pixel electrode ELT2 may extend from the light emitting area EA to the non-light emitting area NEA and the separation area SPA, and may be electrically connected to the first alignment electrode ALE1 and the third alignment electrode ALE3 in the separation area SPA, respectively. The third pixel electrode ELT3 may be formed only in each light emitting area EA, or a portion thereof may be positioned in the non-light emitting area NEA. The position, size, shape, and mutual disposition structure of the pixel electrodes ELT, and/or the positions of the fourth and fifth contact portions CNT4 and CNT5 may be variously changed according to embodiments.

The bank patterns BNP (also referred to as "patterns" or "wall patterns") may be disposed under or below the alignment electrodes ALE to overlap some or a number of the alignment electrodes ALE. For example, each of the bank patterns BNP may include a first bank pattern BNP1, a second bank pattern BNP2, and a third bank pattern BNP3 overlapping portions of the first alignment electrode ALE1, the second alignment electrode ALE2, and the third alignment electrode ALE3, respectively. In an embodiment, at least one bank pattern BNP may extend to the non-light emitting area NEA around the light emitting area EA, but is not limited thereto.

Some or a number of the alignment electrodes ALE may protrude in an upper direction (for example, the third direction DR3) of the pixel PXL by the bank patterns BNP. Accordingly, it is possible to readily control the area in which the light emitting elements LD are aligned, and by reflecting light directed to the bank patterns BNP at a low angle among light emitted from the light emitting elements LD in an upper direction the pixel PXL, it is possible to increase the light efficiency of the pixel PXL.

In an embodiment, at least two adjacent pixels PXL may share at least one bank pattern BNP. For example, the second bank pattern BNP2 and the third bank pattern BNP3 of the pixel PXL (for example, an adjacent pixel at the right side) adjacent in the first direction DR1 may be integral with each other. Similarly, the third bank pattern BNP2 and the second bank pattern BNP2 of another adjacent pixel (for example, an adjacent pixel at the left side) in the first direction DR1 may be integral with each other. The position, structure, number, and/or shape of the bank patterns BNP may be variously changed according to embodiments.

The non-light emitting area NEA may be disposed around each light emitting area EA and/or each separation area SPA. The first bank BNK1 may be disposed in the non-light emitting area NEA.

The first bank BNK1 may include a first opening OPA1 corresponding to each light emitting area EA, and may surround the light emitting area EA. The first bank BNK1 may include second openings OPA2 corresponding to the separation areas SPA, and may surround the separation areas SPA. For example, the first bank BNK1 may include openings OPA corresponding to each light emitting area EA and each separation area SPA.

The first bank BNK1 may include at least one light blocking and/or reflective material. For example, the first bank BNK1 may include at least one of a black matrix material and/or a color filter material of a specific or given color. Accordingly, light leakage between adjacent pixels PXL may be prevented.

The first bank BNK1 may define each light emitting area EA in which the light emitting elements LD should be supplied at the step of supplying the light emitting elements LD to each pixel PXL. For example, the light emitting areas EA of the pixels PXL are separated and partitioned by the first bank BNK1, so that a desired type and/or amount of light emitting element mixture solution may be supplied into each light emitting area EA.

In an embodiment, the first bank BNK1 may include a hydrophobic surface. For example, by forming the first bank BNK1 itself in a hydrophobic pattern by using a hydrophobic material, or by forming a hydrophobic film made of a hydrophobic material on the first bank BNK1, the first bank BNK1 may be formed to have the hydrophobic surface. For example, the first bank BNK1 may be formed by using a hydrophobic organic insulating material having a large contact angle, such as polyacrylate, and accordingly, the first bank BNK1 may be formed in a hydrophobic pattern. Accordingly, the light emitting element mixture solution may stably flow into the light emitting area EA.

Figure 22:
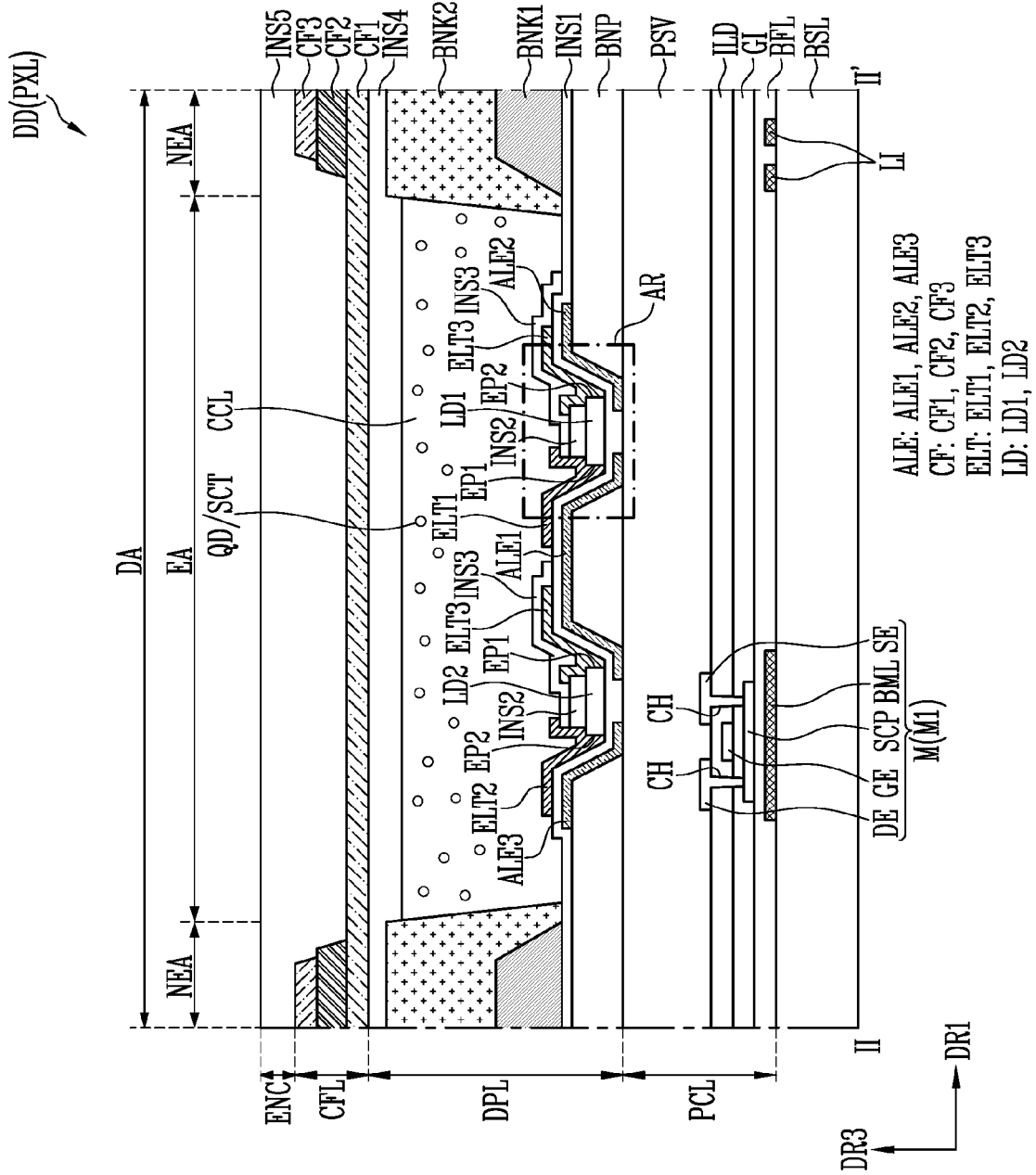
FIG. 22 illustrates a schematic cross-sectional view of a display device according to an embodiment.

FIG. 22 illustrates a schematic cross-sectional view of a display device DD according to an embodiment. For example, FIG. 22 illustrates an embodiment of a cross-section of the display device DD based on a cross-section of the pixel PXL corresponding to line II-II' of FIG. 21.

Referring to FIG. 1 to FIG. 22, the display device DD may include a base layer BSL, a circuit layer PCL, and a display layer DPL. The circuit layer PCL and the display layer DPL may be provided to overlap each other on the base layer BSL. For example, the circuit layer PCL and the display layer DPL may be sequentially disposed on one surface or a surface of the base layer BSL.

The display device DD may further include a color filter layer CFL and/or an encapsulation layer ENC (or a passivation layer) disposed on the display layer DPL. In an embodiment, the color filter layer CFL and/or the encapsulation layer ENC may be formed on or directly formed on one surface or a surface of the base layer BSL on which the circuit layer PCL and the display layer DPL are formed, but are not limited thereto.

The base layer BSL may be a substrate or film of a rigid or flexible material. In an embodiment, the base layer BSL may include at least one insulating material that is transparent or opaque, and may have a single-layered or multi-layered structure.

The circuit layer PCL may be provided on one surface or a surface of the base layer BSL. The circuit layer PCL may include circuit elements forming a pixel circuit PXC of each pixel PXL. For example, circuit elements (for example, transistors M and a capacitor Cst forming each pixel circuit PXC) may be formed in each pixel area of the circuit layer PCL.

FIG. 22 illustrates, as an example of circuit elements that may be disposed on the circuit layer PCL, one transistor M provided in each pixel circuit PXC (for example, the first transistor M1 including the bottom metal layer BML).

The circuit layer PCL may include various signal lines and power lines connected to the pixels PXL. For example, the circuit layer PCL may include scan lines SL, control lines SSL, data lines DL, sensing lines SENL, and/or first and second power lines PL1 and PL2, which are connected to the pixels PXL. FIG. 22 illustrates, as an example of wires that may be disposed on the circuit layer PCL, wires LI positioned on a same layer (for example, a first conductive layer) as the bottom metal layer BML. Each wire LI may be one of the signal lines and the power lines connected to the pixels PXL. In an embodiment, at least one signal line and/or power line may be disposed in the other layer of the circuit layer PCL.

The circuit layer PCL may include insulating layers. For example, the circuit layer PCL may include a buffer layer BFL, a gate insulating layer GI, an interlayer insulating layer ILD, and/or a passivation layer PSV, sequentially disposed on one surface or a surface of the base layer BSL The circuit layer PCL may include a first conductive layer that is disposed on the base layer BSL and may include the bottom metal layer BML of the first transistor M1. For example, the first conductive layer may be disposed between the base layer BSL and the buffer layer BFL, and may include the bottom metal layer BML of the first transistor M1 provided in each pixel circuit PXC. The bottom metal layer BML of the first transistor M1 may overlap a gate electrode GE and a semiconductor pattern SCP of the first transistor M1.

The first conductive layer may further include at least one wire LI. For example, the first conductive layer may include at least some or a number of wires LI of wires extending in the second direction DR2 in the display area DA. For example, the first conductive layer may include the sensing lines SENL and the data lines DL, and the first power line PL1 (or a first sub power line in the second direction forming a mesh-type of first power line PL1) and/or the second power line PL2 (or a second sub power line in the second direction forming a mesh-type of second power line PL2), which are connected to the pixels PXL.

The buffer layer BFL may be disposed on one surface or a surface of the base layer BSL including the first conductive layer. The buffer layer BFL may prevent impurities from diffusing into each circuit element.

A semiconductor layer may be disposed on the buffer layer BFL. The semiconductor layer may include the semiconductor pattern SCP of each transistor M. The semiconductor pattern SCP may include a channel area overlapping a gate electrode GE of the corresponding transistor M, and first and second conductive areas (for example, source and drain areas) disposed at both sides of the channel area. The semiconductor pattern SCP may be a semiconductor pattern made of polysilicon, amorphous silicon, or an oxide semiconductor.

The gate insulating layer GI may be disposed on the semiconductor layer. A second conductive layer may be disposed on the gate insulating layer GI.

The second conductive layer may include the gate electrode GE of each transistor M. The second conductive layer may further include one electrode and/or a bridge pattern of the capacitor Cst provided in the pixel circuit PXC. In case that at least one power line and/or signal line disposed in the display area DA is formed of multiple layers, the second conductive layer may further include at least one conductive pattern forming the at least one power line and/or signal line.

The interlayer insulating layer ILD may be disposed on the second conductive layer. A third conductive layer may be disposed on the interlayer insulating layer ILD.

The third conductive layer may include a source electrode SE and a drain electrode DE of each transistor M. The source electrode SE may be connected to one area (for example, a source area) of the semiconductor pattern SCP included in the corresponding transistor M through at least one contact hole CH, and the drain electrode DE may be connected to the other area (for example, a drain area) of the semiconductor pattern SCP included in the corresponding transistor M through at least one other contact hole CH. The third conductive layer may further include the other electrode of the capacitor Cst, wires, and/or a bridge pattern, provided in the pixel circuit PXC. For example, the third conductive layer may include at least some or a number of wires of wires extending in the first direction DR1 in the display area DA. For example, the third conductive layer may include the scan lines SL, the control lines SSL, the first power line PL1 (or a first sub power line in the first direction forming a mesh-type of first power line PL1), and/or the second power line PL2 (or a second sub power line in the first direction forming a mesh-type of second power line PL2), which are connected to pixels (PXL). In case that at least one power line and/or signal line disposed in the display area DA is formed of multiple layers, the third conductive layer may further include at least one conductive pattern forming the at least one power line and/or signal line.

Each of the conductive pattern, the electrode, and/or the wire forming the first to third conductive layers may have conductivity by including at least one conductive material, but the configuration material is not particularly limited. For example, each of the conductive pattern, the electrode, and/or the wire forming the first to third conductive layers may include one or more of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and, it may include various types of conductive materials.

The passivation layer PSV may be disposed on the third conductive layer. Each of the buffer layer BFL, the gate insulating layer GI, the interlayer insulating layer ILD and the passivation layer PSV may be formed as a single layer or multilayer, and may include at least one inorganic insulating material and/or organic insulating material. In an embodiment, each of the buffer layer BFL, the gate insulating layer GI, and the interlayer insulating layer ILD may include various types of inorganic insulating materials such as a silicon nitride (SiNx), a silicon oxide (SiOx), or a silicon oxynitride (SiOxNy). In an embodiment, the passivation layer PSV may include at least one organic insulating layer including at least one organic insulating material. In an embodiment, the passivation layer PSV may be entirely disposed in at least the display area DA, and may planarize the surface of the circuit layer PCL.

The display layer DPL may be disposed on the passivation layer PSV.

The display layer DPL may include the light emitting part EMU of each pixel PXL. For example, the display layer DPL may include alignment electrodes ALE, at least one light emitting element LD, and pixel electrodes ELT, which are disposed in the light emitting area EA of each pixel PXL. In an embodiment, each light emitting part EMU may include light emitting elements LD.

The display layer DPL may further include insulating patterns and/or insulating layers sequentially disposed on one surface or a surface of the base layer BSL on which the circuit layer PCL is formed. For example, the display layer DPL may include bank patterns BNP, a first insulating layer INS1, a first bank BNK1, a second insulating layer INS2, a third insulating layer INS3, a second bank BNK2, and/or a fourth insulating layer INS4. The display layer DPL may optionally further include a light converting layer CCL.

The bank patterns BNP may be disposed on the passivation layer PSV. The bank patterns BNP may be disposed under or below the alignment electrodes ALE so as to overlap a portion of each of the alignment electrodes ALE.

The alignment electrodes ALE may protrude in an upper direction (for example, the third direction DR3) of the pixel PXL around the light emitting elements LD by the bank patterns BNP. The bank patterns BNP and the alignment electrodes ALE thereon may form a reflective protruding pattern around the light emitting elements LD. Accordingly, the light efficiency of the pixel PXL may be improved.

The bank patterns BNP may be a single-layered or multi-layered insulating patterns including an inorganic insulating material and/or an organic insulating material. The alignment electrodes ALE may be disposed on the bank patterns BNP.

The alignment electrodes ALE may include at least one conductive material. For example, each of the alignment electrodes ALE may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide such as an indium tin oxide (ITO), an indium zinc oxide (IZO), an indium tin zinc Oxide (ITZO), a zinc oxide (ZnO), an aluminum doped zinc oxide (AZO), a gallium doped zinc oxide (GZO), a zinc tin oxide (ZTO), a gallium tin oxide (GTO), and a fluorine doped tin oxide (FTO); and at least one conductive material among conductive polymers such as PEDOT, but are not limited thereto. For example, the alignment electrodes ALE may include other conductive materials in addition to a carbon nanotube or graphene. For example, the alignment electrodes ALE may have conductivity by including at least one of various conductive materials. The alignment electrodes ALE may include conductive materials that are the same as or different from each other.

Each of the alignment electrodes ALE may be formed of a single layer or multilayer. As an example, each alignment electrode ALE may include a reflective electrode layer including a reflective conductive material (for example, metal), and may be formed as a single-layered or multi-layered electrode.

The first insulating layer INS1 may be disposed on the alignment electrodes ALE. In an embodiment, the first insulating layer INS1 may include a contact hole for connecting at least one of the alignment electrodes ALE to one pixel electrode ELT. For example, the first insulating layer INS1 may include contact holes for forming the fourth and fifth contact portions CNT4 and CNT5 of FIG. 21.

The first insulating layer INS1 may be formed as a single layer or multilayer, and may include an inorganic insulating material and/or an organic insulating material. In an embodiment, the first insulating layer INS1 may include at least one type of inorganic insulating material in addition to a silicon nitride (SiNx), a silicon oxide (SiOx), or a silicon oxynitride (SiOxNy).

As the alignment electrodes ALE are covered or overlapped by the first insulating layer INS1, it is possible to prevent the alignment electrodes ALE from being damaged in a subsequent process. It is possible to prevent the alignment electrodes ALE and the light emitting elements LD from being improperly connected to cause a short defect.

The first bank BNK1 may be disposed in the display area DA in which the alignment electrodes ALE and the first insulating layer INS1 are formed. The first bank BNK1 may be formed in the non-light emitting area NEA to surround the light emitting area EA of each pixel PXL.

The light emitting elements LD may be supplied to each light emitting area EA surrounded by the first bank BNK1. The light emitting elements LD may be aligned between the alignment electrodes ALE by alignment signals applied to the alignment electrodes ALE (or, the alignment lines before being separated into the alignment electrodes ALE of each pixel PXL). For example, in case that it is assumed that the pixel PXL may include the first alignment electrode ALE1 positioned in a center and the second and third alignment electrodes ALE2 and ALE3 positioned at both sides of the first alignment electrode ALE1, at least one first light emitting element LD1 may be aligned between the first alignment electrode ALE1 and the second alignment electrode ALE2, and at least one second light emitting element LD2 may be aligned between the first alignment electrode ALE1 and the third alignment electrode ALE3.

The second insulating layer INS2 may be disposed on one portion of the light emitting elements LD. In an embodiment, the second insulating layer INS2 may be locally disposed on one portion including a central portion of the light emitting elements LD so as to expose the first and second end portions EP1 and EP2 of the light emitting elements LD aligned in the light emitting area EA of the corresponding pixel PXL. In an embodiment, the second insulating layer INS2 may be entirely formed in the display area DA including pixel areas, and may include contact holes exposing the first end portion EP1 and the second end portion EP2 of each of the light emitting elements LD. In case that the second insulating layer INS2 is formed on the light emitting elements LD, the light emitting elements LD may be stably fixed.

The second insulating layer INS2 may be formed as a single layer or multilayer, and may include at least one inorganic insulating material and/or organic insulating material. For example, the second insulating layer INS2 may include a silicon nitride (SiNx), a silicon oxide (SiOx), a silicon oxynitride (SiOxNy), an aluminum oxide (AlxOy), or a photo resist material, and various types of organic and/or inorganic insulating materials.

Different pixel electrodes ELT may be disposed and/or formed on both end portions of the light emitting elements LD not covered or overlapped by the second insulating layer INS2, for example, on the first and second end portions EP1 and EP2. For example, the first pixel electrode ELT1 may be disposed on the first end portion EP1 of the first light emitting element LD1, and a portion of the third pixel electrode ELT3 may be disposed on the second end portion EP2 of the first light emitting element LD1. The other portion of the third pixel electrode ELT3 may be disposed on the first end portion EP1 of the second light emitting element LD2, and the second pixel electrode ELT2 may be disposed on the second end portion EP2 of the second light emitting element LD2.

In an embodiment, the first pixel electrode ELT1 may be electrically connected to the first alignment electrode ALE1 through at least one contact portion (for example, the fourth contact portion CNT4 of FIG. 21). In an embodiment, the second pixel electrode ELT2 may be electrically connected to the third alignment electrode ALE3 through at least one contact portion (for example, the fifth contact portion CNT5 of FIG. 21). The third pixel electrode ELT3 may electrically connect at least one first light emitting element LD1 and at least one second light emitting element LD2 to each other.

In an embodiment, the first alignment electrode ALE1 of each pixel PXL may be electrically connected to the first transistor M1 of the corresponding pixel PXL through at least one contact portion (for example, the first contact portion CNT1 of FIG. 21). Similarly, the second and third alignment electrodes ALE2 and ALE3 may be electrically connected to the second power line PL2 through at least one contact portion (for example, the second contact portion CNT2 and the third contact portion CNT3 of FIG. 21), respectively.

The first pixel electrode ELT1 may be disposed at an upper portion of the first alignment electrode ALE1 to overlap a portion of the first alignment electrode ALE1, and the second pixel electrode ELT2 may be disposed at an upper portion of the third alignment electrode ALE3 to overlap a portion of the third alignment electrode ALE3. The third pixel electrode ELT3 may be disposed on upper portions of the first alignment electrode ALE1 and the second alignment electrode ALE2 to overlap another portion of the first alignment electrode ALE1 and the second alignment electrode ALE2.

In an embodiment, the first pixel electrode ELT1 may be electrically connected to the first end portion EP1 of the first light emitting element LD1, and the second pixel electrode ELT2 may be electrically connected to the second end portion EP2 of the second light emitting element LD2. The third pixel electrode ELT3 may be electrically connected to the second end portion EP2 of the first light emitting element LD1 and the first end portion EP1 of the second light emitting element LD2.

The first pixel electrode ELT1, the second pixel electrode ELT2, and/or the third pixel electrode ELT3 may be formed on a same layer or different layers. In an embodiment, the first and second pixel electrodes ELT1 and ELT2 may be formed on a same layer, and the third pixel electrode ELT3 may be formed on a different layer from the first and second pixel electrodes ELT1 and ELT2. For example, the first and second pixel electrodes ELT1 and ELT2, and the third pixel electrode ELT3 may be disposed on different layers with the third insulating layer INS3 interposed therebetween. In an embodiment, all of the first to third electrodes ELT1 to ELT3 may be formed on a same layer. The pixel PXL may not include the third insulating layer INS3. The mutual position and/or formation order of the pixel electrodes ELT may be variously changed according to embodiments.

As in an embodiment of FIG. 19, in case that each pixel PXL may include the light emitting part EMU having a parallel structure or each pixel PXL may include a single light emitting element LD, the pixel PXL may not include the third pixel electrode ELT3. The first pixel electrode ELT1 may be disposed on the first end portions EP1 of the light emitting elements LD, and the second pixel electrode ELT2 may be disposed on the second end portions EP2 of the light emitting elements LD.

The pixel electrodes ELT may include at least one conductive material. In an embodiment, the pixel electrodes ELT may include a transparent conductive material to allow light emitted from the light emitting elements LD to pass therethrough.

In an embodiment, the display device DD may include the light converting layer CCL disposed on the light emitting part EMU of each pixel PXL. For example, the light converting layer CCL may be provided in each light emitting area EA to be positioned at an upper portion of the light emitting elements LD of each pixel PXL.

The display device DD may further include the second bank BNK2 disposed in the non-light emitting area NEA to overlap the first bank BNK1. The second bank BNK2 may define (or partition) each light emitting area EA in which the light converting layer CCL may be formed. In an embodiment, the second bank BNK2 and the first bank BNK1 may be integral with each other.

The second bank BNK2 may include a light blocking and/or reflective material including a black matrix material. The second bank BNK2 may include a same material or a similar material as or different material from the first bank BNK1.

The light converting layer CCL may include at least one of wavelength converting particles (or color converting particles) for converting the wavelength and/or color of light emitted from the light emitting elements LD, and light scattering particles SCT for increasing light output efficiency of the pixel PXL by scattering light emitted from the light emitting elements LD. For example, each light converting layer CCL may be disposed on each light emitting part EMU. Each light converting layer CCL may include the wavelength converting particles such as at least one type of quantum dots QD (for example, red, green, and/or blue quantum dots), and/or the light scattering particles SCT.

For example, in case that one pixel PXL is set as a red (or green) pixel and blue light emitting elements LD are provided to the light emitting part EMU of the pixel PXL, the light converting layer CCL including red (or green) quantum dots QD for converting blue light into red (or green) light may be disposed on the light emitting part EMU of the pixel PXL. The light converting layer CCL may further include the light scattering particles SCT.

The fourth insulating layer INS4 may be formed on one surface or a surface of the base layer BSL including the light emitting parts EMU and/or the light converting layers CCL of the pixels PXL.

In an embodiment, the fourth insulating layer INS4 may include at least one organic insulating layer. The fourth insulating layer INS4 may be entirely disposed in at least the display area DA, and may substantially planarize the surface of the display layer DPL. The fourth insulating layer INS4 may protect the light emitting parts EMU and/or the light converting layers CCL of the pixels PXL.

The color filter layer CFL may be disposed on the fourth insulating layer INS4.

The color filter layer CFL may include color filters CF corresponding to the color of the pixels PXL. For example, the color filter layer CFL may include a first color filter CF1 disposed in the light emitting area EA of the first color pixel PXL1, a second color filter CF2 disposed in the light emitting area EA of the second color pixel PXL2, and a third color filter CF3 disposed in the light emitting area EA of the third color pixel PXL3. Each color filter CF may be provided on the fourth insulating layer INS4 to overlap the light emitting part EMU of the corresponding pixel PXL.

In an embodiment, the first, second, and third color filters CF1, CF2, and CF3 may be disposed to overlap each other in the non-light emitting area NEA. In an embodiment, the first, second, and third color filters CF1, CF2, and CF3 are formed separately from each other on the light emitting area EA of each pixel PXL, and a separate light blocking pattern may be disposed between the first, second, and third color filters CF1, CF2, and CF3.

The encapsulation layer ENC may be disposed on the color filter layer CFL. The encapsulation layer ENC may include a fifth insulating layer INS5. In an embodiment, the fifth insulating layer INS5 may include at least one organic insulating layer including at least one organic insulating material, and may be formed as a single layer or multilayer.

The fifth insulating layer INS5 may be entirely formed in at least the display area DA to cover or overlap the circuit layer PCL, the display layer DPL, and/or the color filter layer CFL, and may planarize the surface of the display device DD.

Figure 23:
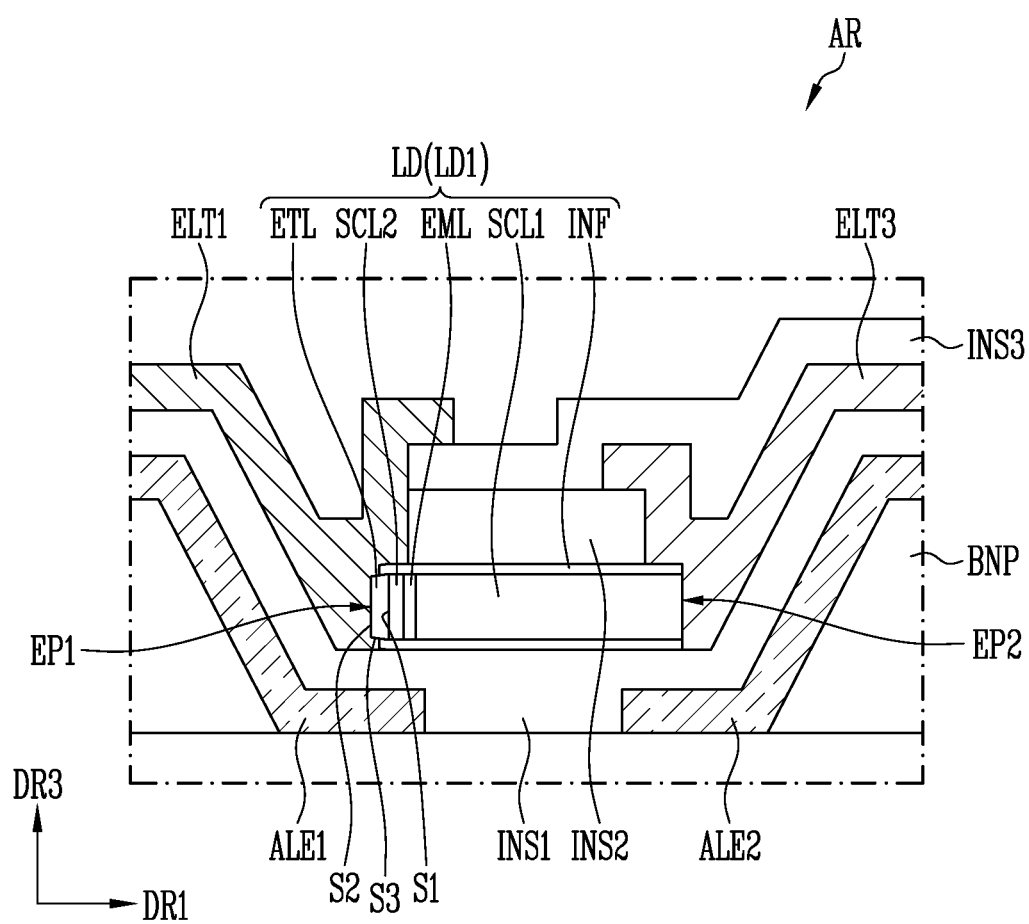
FIG. 23 illustrates an enlarged schematic cross-sectional view of one area of the pixel shown in FIG. 22.

FIG. 23 illustrates an enlarged schematic cross-sectional view of one area of the pixel PXL shown in FIG. 22. For example, FIG. 23 illustrates an enlarged schematic cross-sectional view of one area (for example, an AR area of FIG. 22) of the pixel PXL based on the first light emitting element LD1. In an embodiment, the light emitting elements LD included in the pixels PXL may be light emitting elements (LD) of substantially the same or similar type and/or structure. For example, the second light emitting element LD2 may be a light emitting element LD having the same type and/or structure as that of the first light emitting element LD1.

FIG. 23 illustrates an embodiment in which the pixel PXL of FIG. 22 may include the light emitting element LD according to an embodiment of FIG. 1 and FIG. 2, but the disclosure is not limited thereto. For example, the pixel PXL may include a light emitting element LD according to one of the embodiments of FIG. 3 to FIG. 7, or light emitting elements LD having a shape and/or structure to which at least two of the embodiments of FIG. 2 to FIG. 7 are compositely applied. In describing an embodiment of FIG. 23, a detailed description of a configuration similar to or the same as that of the above-described embodiments will be omitted.

Referring to FIG. 1 to FIG. 23, each light emitting element LD included in the pixel PXL may include the first semiconductor layer SCL1, the emission layer (EML), the second semiconductor layer SCL2, and the electrode layer ETL, which are sequentially disposed from the second end portion EP2 to the first end portion EP1. Each light emitting element LD may include the insulating film INF surrounding the side surfaces of the first semiconductor layer SCL1, the emission layer EML, the second semiconductor layer SCL2, and the electrode layer ETL.

The electrode layer ETL may include the first surface S1 adjacent to the second semiconductor layer SCL2 (for example, in contact with the second semiconductor layer SCL2), the second surface S2 facing the first surface S1 and having a width and/or area smaller (or less than) than the first surface S1, and the side surface S3 connecting the first surface S1 and the second surface S2. The side surface S3 of the electrode layer ETL may have a slope corresponding to an angle (θ) in a range of about 75° to about 90° with respect to the first surface S1 of the electrode layer ETL.

The insulating film INF may completely surround the side surfaces of the emission layer EML and the second semiconductor layer SCL2, and may at least partially surround the side surfaces of the electrode layer ETL and the first semiconductor layer SCL1. The insulating film INF may partially expose the electrode layer ETL and the first semiconductor layer SCL1 at the first end portion EP1 and the second end portion EP2 of the light emitting element LD, respectively.

The electrode layer ETL may be electrically connected to the first pixel electrode ELT1. For example, the electrode layer ETL may contact or directly contact the first pixel electrode ELT1 at the first end portion EP1 of the light emitting element LD in which the second insulating layer INS2 is not provided, and may be electrically connected to the first pixel electrode ELT1.

In an embodiment, the electrode layer ETL may contact or directly contact the second semiconductor layer SCL2 on the first surface S1. The side surface S3 of the electrode layer ETL may be surrounded by the insulating film INF at a portion corresponding to at least the first surface S1. For example, the insulating film INF may surround a portion of the side surface S3 of the electrode layer ETL positioned around the first surface S1 of the electrode layer ETL, and may expose the second surface S2 of the electrode layer ETL and the other portion of the side surface S3 of the electrode layer ETL positioned around the second surface S2.

The first semiconductor layer SCL1 may be electrically connected to the third pixel electrode ELT3 (and/or second pixel electrode ELT2). For example, the first semiconductor layer SCL1 may contact or directly contact the third pixel electrode ELT3 at the second end portion EP2 of the light emitting element LD in which the second insulating layer INS2 is not provided, and may be electrically connected to the third pixel electrode ELT3.

Figure 24:
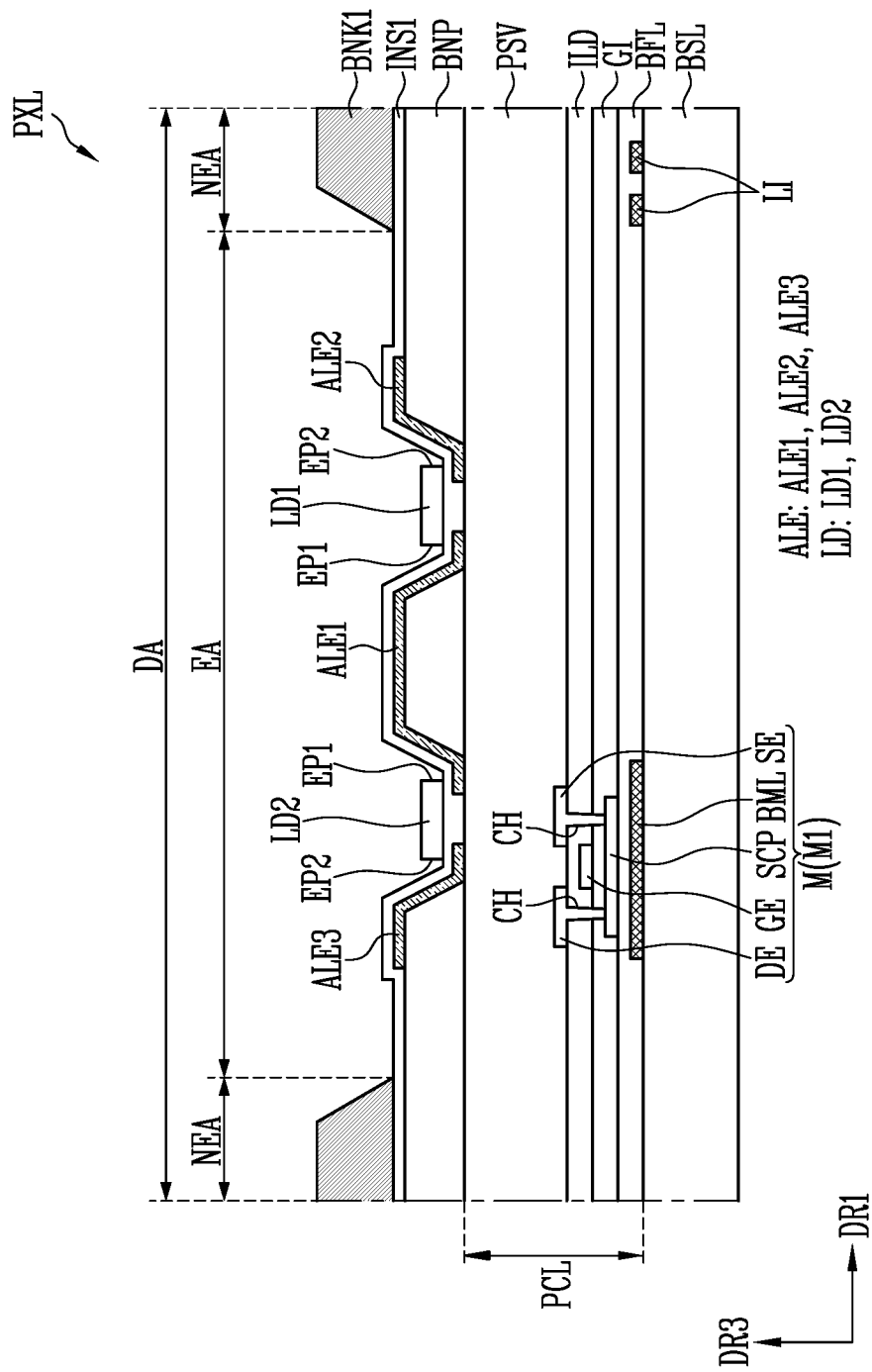
FIG. 24 to FIG. 26 illustrate schematic cross-sectional views of a manufacturing method of a pixel according to an embodiment.
Figure 25:
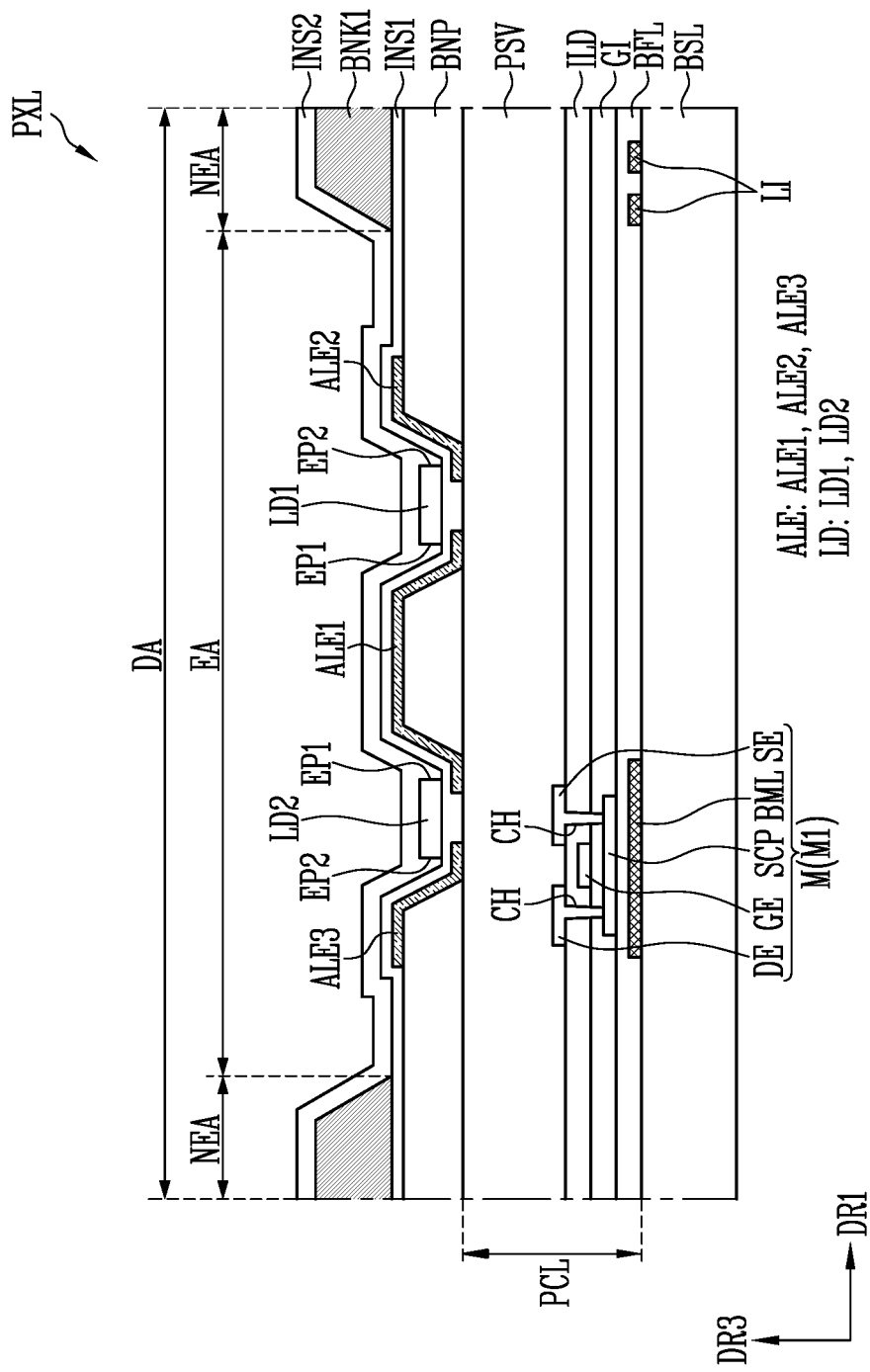
Figure 26:
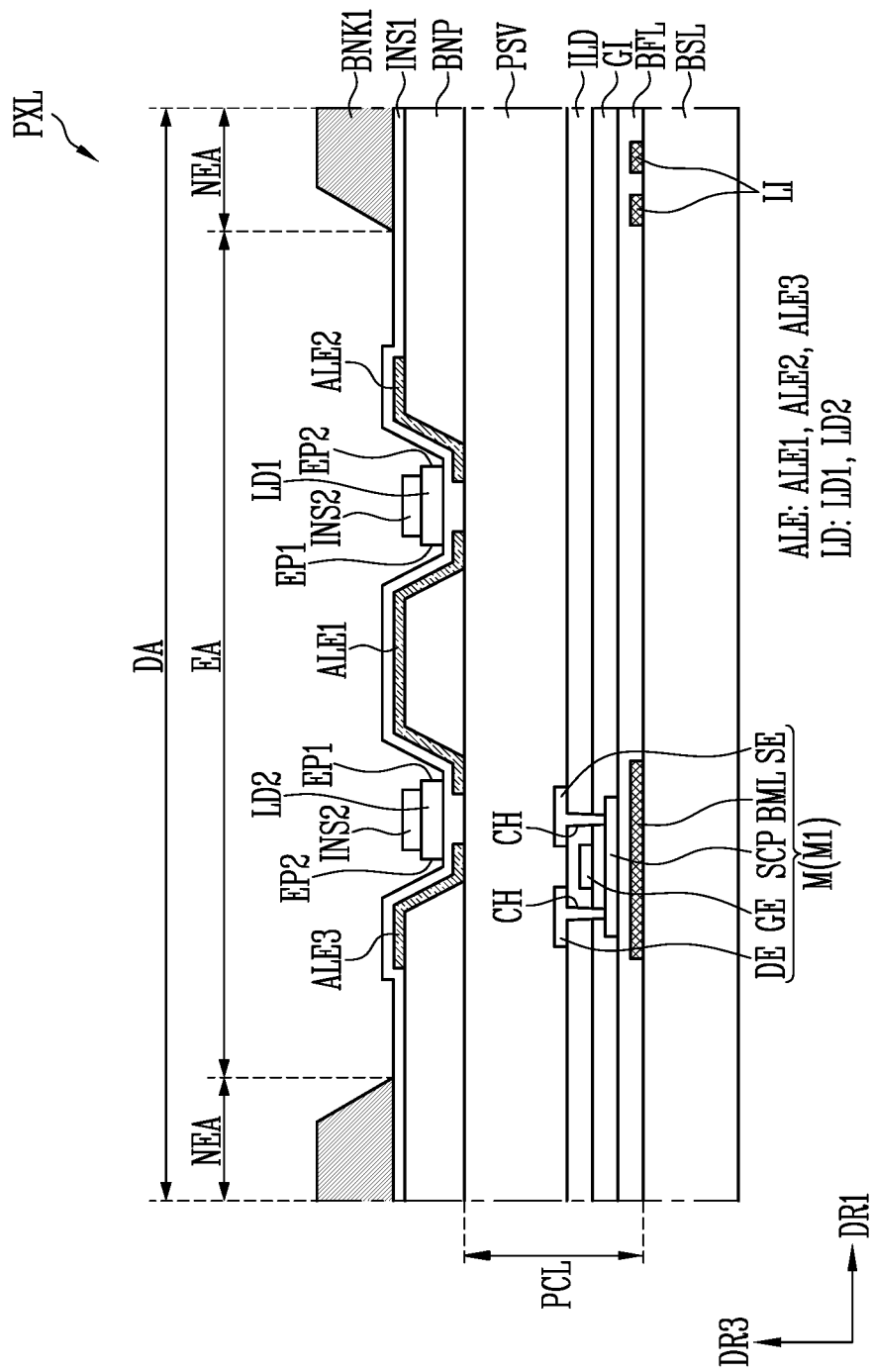

FIG. 24 to FIG. 26 illustrate schematic cross-sectional views of a manufacturing method of a pixel PXL according to an embodiment. For example, FIG. 24 to FIG. 26 sequentially illustrate a method of disposing at least one light emitting element LD in each pixel PXL and a method of forming the second insulating layer INS2 on the light emitting element LD, during the pixel process for manufacturing the pixel PXL according to an embodiment of FIG. 22 and FIG. 23.

Referring to FIG. 1 to FIG. 24, between a pair of alignment electrodes ALE covered or overlapped by the first insulating layer INS1 (for example, between the first and second alignment electrodes ALE1 and ALE2 and/or the first and third alignment electrodes ALE1 and ALE3), at least one light emitting element LD may be aligned and/or disposed. In an embodiment, light emitting elements LD may be supplied to each light emitting area EA defined by the first bank BNK1 by utilizing an inkjet method or a slit coating method. By applying respective alignment signals to the alignment electrodes ALE, the light emitting elements LD may be aligned between the alignment electrodes ALE.

Referring to FIG. 25, the second insulating layer INS2 may be formed in the display area DA in which the light emitting elements LD are aligned in the light emitting area EA of each pixel PXL. The second insulating layer INS2 may be primarily entirely formed in the display area DA.

Referring to FIG. 26, the second insulating layer INS2 may be etched to expose the first end portion EP1 and the second end portion EP2 of each of the light emitting elements LD. For example, the second insulating layer INS2 may be patterned so that the electrode layer ETL and the first semiconductor layer SCL1 are respectively exposed at the first end portion EP1 and the second end portion EP2 of each of the light emitting elements LD. Thereafter, by forming respective pixel electrodes ELT on the first end portion EP1 and the second end portion EP2 of each of the light emitting elements LD in a subsequent process, the light emitting elements LD may be electrically connected between at least a pair of pixel electrodes ELT.

In an embodiment, in the process of etching the second insulating layer INS2, in the first and second end portions EP1 and EP2 of the light emitting element LD and/or the peripheral area thereof, the insulating film INF may be etched by a thickness. However, in the disclosure as in the above-described embodiments, by controlling the side slope of the electrode layer ETL, even in the area corresponding to the bonding surface of the second semiconductor layer SCL2 and the electrode layer ETL (for example, an area corresponding to the periphery of the first surface S1 of the electrode layer ETL), the insulating film INF may be formed with a thickness greater than or equal to a thickness corresponding to a process margin (for example, over-etching margin) in a subsequent process. Accordingly, even after the etching of the second insulating layer INS2 is completed, the second semiconductor layer SCL2 may be completely surround by the insulating film INF.

Therefore, according to embodiments, it is possible to prevent a short circuit defect (for example, a short circuit defect that may occur through the second semiconductor layer SCL2) due to exposure of the second semiconductor layer SCL2, and it is possible to stably connect the light emitting element LD between the pixel electrodes ELT. Accordingly, it is possible to prevent a defect of the pixel PXL (for example, a dark spot defect) due to a short circuit defect through the light emitting element LD.

The disclosure has been described according to embodiments, but it should be noted that the foregoing embodiments are provided only for illustration while not limiting the disclosure. It will be understood by those skilled in the art that various changes in form and details may be made therein without departing from the scope of the disclosure.

The technical scope of the disclosure may be determined by the technical scope of the accompanying claims. All changes or modifications that come within the meaning and range of the claims and their equivalents will be interpreted as including the range of the disclosure.

What is claimed is:

1. A light emitting element comprising:
   a first semiconductor layer;
   an emission layer disposed on the first semiconductor layer;
   a second semiconductor layer disposed on the emission layer;
   an electrode layer disposed on the second semiconductor layer; and
   an insulating film surrounding side surfaces of the first semiconductor layer, the emission layer, and the second semiconductor layer and surrounding a portion of the electrode layer at an end portion of the light emitting element on which the electrode layer is disposed,
   the electrode layer includes:
      a first surface adjacent to the second semiconductor layer;
      a second surface facing the first surface and having a width less than a width of the first surface; and
      a side surface that connects the first surface and the second surface has an angle in a range of about 75° to less than 90° with respect to the first surface of the electrode layer.

2. The light emitting element of claim 1, wherein the insulating film completely surrounds the side surfaces of the emission layer and the second semiconductor layer.

3. The light emitting element of claim 1, wherein the first surface of the electrode layer directly electrically contacts the second semiconductor layer.

4. The light emitting element of claim 3, wherein
   the insulating film surrounds a portion of the side surface of the electrode layer disposed around the first surface of the electrode layer, and exposes the second surface of the electrode layer and a remaining portion of the side surface of the electrode layer.

5. The light emitting element of claim 1, wherein the insulating film does not cover a lower surface of the first semiconductor layer.

6. The light emitting element of claim 1, wherein the insulating film has a uniform thickness at the end portion of the light emitting element.

7. The light emitting element of claim 1, wherein the insulating film has a surface profile corresponding to a shape of each side surface of the first semiconductor layer, the emission layer, and the second semiconductor layer in a portion surrounding the first semiconductor layer, the emission layer, and the second semiconductor layer.

8. The light emitting element of claim 1, wherein the insulating film has a surface profile corresponding to a shape of the side surface of the electrode layer at the end portion of the light emitting element.

9. The light emitting element of claim 1, wherein the insulating film has a thickness that is gradually changed at the end portion of the light emitting element.

10. The light emitting element of claim 9, wherein the insulating film has a thickness that increases as approaching the emission layer at the end portion of the light emitting element.

11. The light emitting element of claim 1, wherein
the first semiconductor layer includes a first portion adjacent to the emission layer and a second portion excluding the first portion, and
a width of the first portion is greater than a width of the second portion.

12. The light emitting element of claim 11, wherein a thickness of a portion surrounding the second portion of the first semiconductor layer is greater than a thickness of a portion surrounding the first portion of the first semiconductor layer in the insulating film.

13. The light emitting element of claim 1, wherein the insulating film has a thickness of about 10 nm or more at a portion corresponding to the first surface of the electrode layer.

14. The light emitting element of claim 13, wherein
the electrode layer has a thickness in a range of about 100 nm to about 200 nm, and
the electrode layer is comprised of at least one of chromium (Cr), titanium (Ti), aluminum (Al), gold (Au), nickel (Ni), or copper (Cu), and an oxide thereof, alloy thereof, an indium tin oxide (ITO), an indium zinc oxide (IZO), an indium tin zinc oxide (ITZO), a zinc oxide (ZnO), and an indium oxide ($In_2O_3$).

15. The light emitting element of claim 1, wherein
the insulating film surrounds a portion of the side surface of the electrode layer, and
the insulating film exposes another portion of the side surface of the electrode layer.

* * * * *